United States Patent
Martin et al.

(10) Patent No.: US 11,731,524 B2
(45) Date of Patent: Aug. 22, 2023

(54) MOBILE DIRECT CURRENT FAST CHARGER CUSTOMER-VEHICLE-STATION MATCHING SYSTEM

(71) Applicant: GM GLOBAL TECHNOLOGY OPERATIONS LLC, Detroit, MI (US)

(72) Inventors: Alan B. Martin, Washington, MI (US); Matthew C. Kirklin, Lake Orion, MI (US); Charles E. Freese, V, Ira Township, MI (US); Margarita M. Mann, Royal Oak, MI (US); William H. Pettit, Rochester, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 121 days.

(21) Appl. No.: 16/424,039

(22) Filed: May 28, 2019

(65) Prior Publication Data
US 2020/0376972 A1 Dec. 3, 2020

(51) Int. Cl.
*B60L 53/30* (2019.01)
*B60L 53/54* (2019.01)
*H01M 16/00* (2006.01)
*B60L 53/68* (2019.01)
*G01R 31/382* (2019.01)
(Continued)

(52) U.S. Cl.
CPC ............ *B60L 53/305* (2019.02); *B60L 53/11* (2019.02); *B60L 53/16* (2019.02); *B60L 53/54* (2019.02); *B60L 53/57* (2019.02); *B60L 53/63* (2019.02); *B60L 53/68* (2019.02); *G01R 31/382* (2019.01); *H01M 16/006* (2013.01); *Y02T 90/12* (2013.01); *Y02T 90/14* (2013.01); *Y02T 90/167* (2013.01)

(58) Field of Classification Search
CPC .......... B60L 53/16; B60L 53/54; B60L 53/68; B60L 53/305; Y02T 90/12; Y02T 90/167; Y02E 60/10; Y02E 60/50; H01M 16/006; G01R 31/382; Y04S 30/12
See application file for complete search history.

(56) References Cited

U.S. PATENT DOCUMENTS

| 2002/0132144 A1* | 9/2002 | McArthur | G06Q 30/06 429/513 |
| 2012/0245750 A1* | 9/2012 | Paul | H02J 3/14 700/291 |

(Continued)

*Primary Examiner* — Richard Isla
*Assistant Examiner* — Johali A Torres Ruiz
(74) *Attorney, Agent, or Firm* — Quinn IP Law

(57) ABSTRACT

A system for matching a plurality of electrically powered vehicles to a plurality of available mobile chargers includes a computerized server device programmed to monitor optimization inputs related to the plurality of available mobile chargers, monitor optimization inputs related to the plurality of electrically powered vehicles operated by a plurality of customers, determine a lowest-cost-based ranked listing of matched charger and vehicle pairings for each of the plurality of customers based upon the optimization inputs related to the plurality of available chargers and the optimization inputs related to the plurality of the electrically powered vehicles, present the ranked listing of matched charger and vehicle pairings to each of the customers, monitor selection by each of the plurality of customers of a desired charger for the customer from the ranked listing, and direct each of the plurality of customers to the desired charger for the customer.

19 Claims, 12 Drawing Sheets

(51) Int. Cl.
*B60L 53/16* (2019.01)
*B60L 53/63* (2019.01)
*B60L 53/10* (2019.01)
*B60L 53/57* (2019.01)

(56) References Cited

U.S. PATENT DOCUMENTS

| | | | |
|---|---|---|---|
| 2012/0303397 A1* | 11/2012 | Prosser | B60L 53/18 |
| | | | 705/7.12 |
| 2014/0125279 A1* | 5/2014 | Juhasz | B60L 3/12 |
| | | | 320/109 |
| 2018/0052505 A1* | 2/2018 | Cruickshank, III | H02J 3/00 |
| 2019/0139162 A1* | 5/2019 | Sawada | G06Q 10/02 |
| 2019/0160958 A1* | 5/2019 | Chaudhary | B60L 53/665 |
| 2019/0351783 A1* | 11/2019 | Goei | B60L 53/67 |
| 2020/0001724 A1* | 1/2020 | Jordan, III | B60L 53/665 |
| 2020/0101863 A1* | 4/2020 | Westin | B60L 53/126 |
| 2020/0262307 A1* | 8/2020 | Rosene | B60L 53/67 |
| 2020/0317084 A1* | 10/2020 | Schaffer | B60L 50/00 |

* cited by examiner

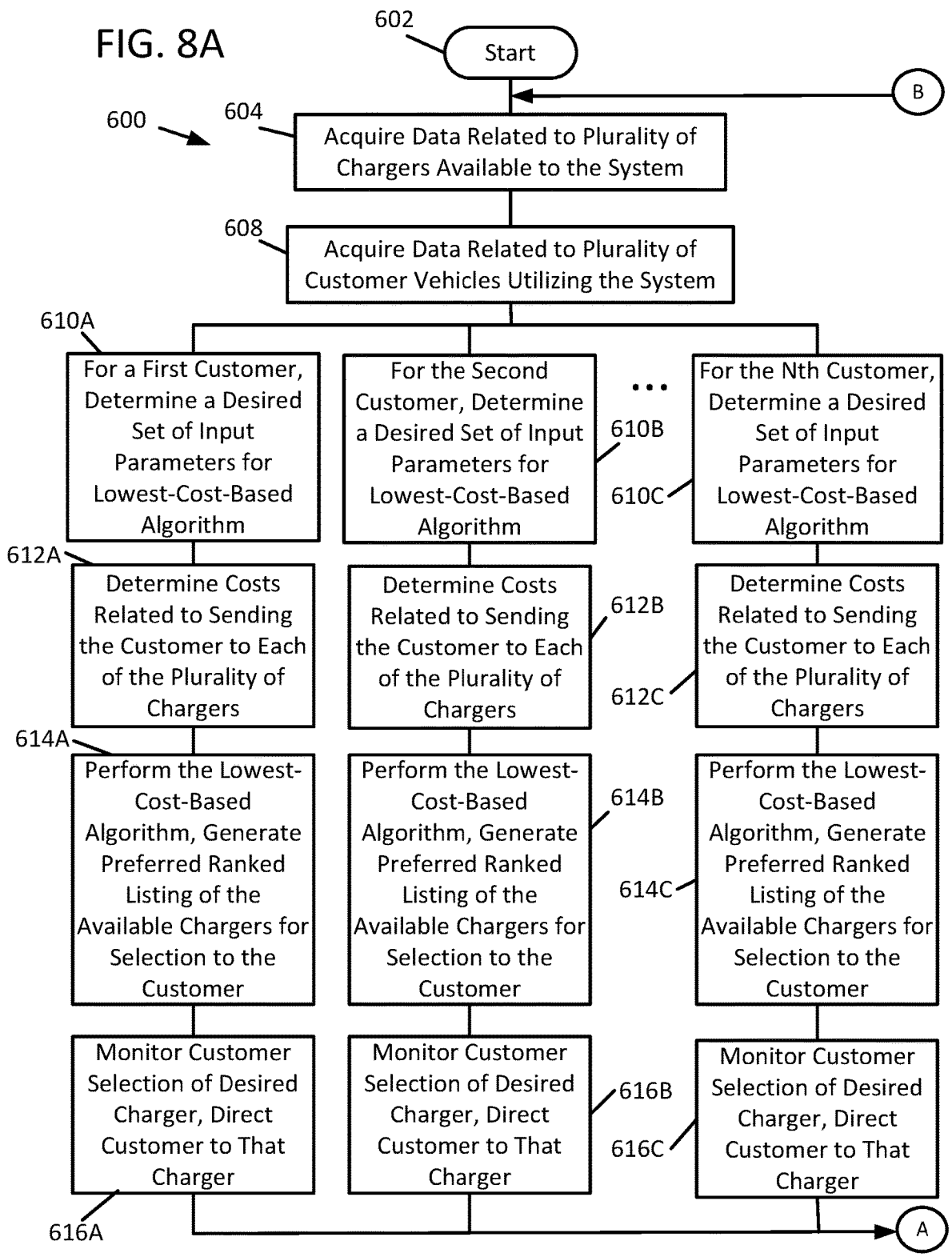

MOBILE DIRECT CURRENT FAST CHARGER CUSTOMER-VEHICLE-STATION MATCHING SYSTEM

INTRODUCTION

The disclosure generally relates to a method of operating a fuel cell stack.

Fuel cells are electrochemical devices which combine a fuel such as hydrogen and an oxidant such as oxygen to produce electricity. The term "fuel cell" is typically used to refer to either a single cell or a plurality of cells depending upon the context in which it is used. The plurality of cells is typically bundled together and arranged to form a stack with the plurality of cells commonly arranged in electrical series.

Different fuel cell types may be provided such as phosphoric acid, alkaline, molten carbonate, solid oxide, and proton exchange membrane (PEM), for example. The basic components of a PEM-type fuel cell are two electrodes separated by a polymer membrane electrolyte. Each electrode is coated on one side with a thin catalyst layer. The electrodes, catalyst, and membrane together form a membrane electrode assembly (MEA).

In a typical PEM-type fuel cell, the MEA is sandwiched between "anode" and "cathode" diffusion mediums (hereinafter "DM's") or diffusion layers that are formed from a resilient, conductive, and gas permeable material such as carbon fabric or paper. The DM's serve as the primary current collectors for the anode and cathode as well as provide mechanical support for the MEA and manage gas and water transport between the channels and the MEA. The DM's and MEA are pressed between a pair of electronically conductive plates e.g., a monopolar plate or a bipolar plate, which serve as secondary current collectors for collecting the current from the primary current collectors.

Monopolar plates may include a single thin metal sheet, whereas the bipolar plates typically include two thin, facing metal sheets. The sheets define a flow path on one outer surface thereof for delivery of the fuel to the anode of the MEA, or the oxidant for delivery to the cathode side of the MEA. In the case of a bipolar plate, an outer surface of the other sheet defines a flow path for the other of the fuel to the anode of the MEA, or the oxidant for delivery to the cathode side of the MEA. In the case of bipolar plates, when the sheets are joined, the joined surfaces may define a flow path for a dielectric cooling fluid. The plates are typically produced from a formable metal that provides suitable strength, electrical conductivity, and corrosion resistance. In another example, the plates may be Electric vehicles have a range defined by the limited energy storage capacity of the vehicle. If the vehicle is battery powered, the vehicle will move only so long as the energy storage device(s) of the vehicle may provide a minimum necessary voltage to the electric machine(s) used to propel the vehicle. Energy storage devices may be recharged regularly to permit the vehicle to refresh its maximum available range.

According to one known method to recharge energy storage devices, one may attach a charging cable from a charger (or otherwise described as a charging station) to a charging port on the vehicle. Such a charger may be connected to a power grid such as an electric power grid maintained by a dedicated third party power company, which may operate natural gas, coal, nuclear, and/or renewable energy stations such as wind turbines, solar panels, and hydroelectric power to provide power to the electric power grid. Typical infrastructure useful to recharge vehicle is typically fixed in location, tied to a building and a plot of land.

A time necessary to recharge an energy storage device or a recharge time may be made shorter based upon utilizing charging devices that use higher power. A maximum recharge power may be defined for specific energy storage devices. In one exemplary embodiment, a maximum recharging power may be provided at 50 kilowatts. In another example, a maximum recharging power may be provided at 250 kilowatts.

According to another known method to recharge energy storage devices, one may attach a fuel cell-powered recharging device to the vehicle. Such fuel cell devices may be advantageous. Fuel cell devices may provide relatively high power such that charging times for energy storage devices utilizing the fuel cell devices to recharge may be minimized.

SUMMARY

A computerized system for matching a plurality of electrically powered vehicles to a plurality of available mobile chargers includes a computerized server device. The computerized server device is programmed to monitor optimization inputs related to the plurality of available mobile chargers, monitor optimization inputs related to the plurality of electrically powered vehicles operated by a plurality of customers, determine a lowest-cost-based ranked listing of matched charger and vehicle pairings for each of the plurality of customers based upon the optimization inputs related to the plurality of available chargers and the optimization inputs related to the plurality of the electrically powered vehicles, present the ranked listing of matched charger and vehicle pairings for each of the plurality of customers to each of the customers, monitor selection by each of the plurality of customers of a desired charger for the customer from the ranked listing, and direct each of the plurality of customers to the desired charger for the customer.

In some embodiments, the computerized server device is further programmed to determine patterns of use of the mobile chargers; and direct the plurality of available mobile chargers to new locations based upon the determined patterns of use.

In some embodiments, the computerized server device programmed to determine the lowest-cost-based ranked listing of matched charger and vehicle pairings for each of the plurality of customers based upon the optimization inputs related to the plurality of available chargers includes the computerized server device being programmed to determine the lowest-cost-based ranked listing based upon one of the optimization inputs related to the plurality of available chargers selected from one of geographic locations of the plurality of available mobile chargers, a fuel cell efficiency vs. load determination for each of the plurality of available mobile chargers, and a remaining hydrogen fuel and ease of replenishment determination for each of the plurality of available mobile chargers.

In some embodiments, the computerized server device programmed to determine the lowest-cost-based ranked listing of matched charger and vehicle pairings for each of the plurality of customers based upon the optimization inputs related to the plurality of available chargers includes the computerized server device being programmed to determine the lowest-cost-based ranked listing based upon one of the optimization inputs related to the plurality of available chargers selected from one of a cost determination for each of the plurality of available mobile chargers, a forecast cost of hydrogen fuel for the station determination for each of the plurality of available mobile chargers, an electrical energy or SOC remaining in a rechargeable energy storage system determination for each of the plurality of available mobile chargers, and a thermal energy remaining in a thermal buffer determination for each of the plurality of available mobile chargers.

In some embodiments, the computerized server device programmed to determine the lowest-cost-based ranked listing of matched charger and vehicle pairings for each of the plurality of customers based upon the optimization inputs related to the plurality of available chargers includes the computerized server device being programmed to determine the lowest-cost-based ranked listing based upon one of the optimization inputs related to the plurality of available chargers selected from one of an on/off state determination for each of the plurality of available mobile chargers, an off timer setting determination for each of the plurality of available mobile chargers, a temperature of each fuel cell stack determination for each of the plurality of available mobile chargers, a weather forecast determination for each of the plurality of available mobile chargers, a solar forecast determination for each of the plurality of available mobile chargers, and a predicted harvestable and rejectable energy available determination for each of the plurality of available mobile chargers.

In some embodiments, the computerized server device programmed to determine the lowest-cost-based ranked listing of matched charger and vehicle pairings for each of the plurality of customers based upon optimization inputs related to the plurality of electrically powered vehicles operated by the plurality of customers includes the computerized server device being programmed to determine the lowest-cost-based ranked listing based upon one of the optimization inputs related to the plurality of electrically powered vehicles operated by the plurality of customers selected from a location of each of the plurality of vehicles relative each of the plurality of available mobile chargers, historical parameters of each of the plurality of vehicles, vehicle brand for each of the plurality of vehicles, and a vehicle battery predicted charge profile for each of the plurality of vehicles.

In some embodiments, the computerized server device programmed to determine the lowest-cost-based ranked listing of matched charger and vehicle pairings for each of the plurality of customers based upon optimization inputs related to the plurality of electrically powered vehicles operated by the plurality of customers includes the computerized server device being programmed to determine the lowest-cost-based ranked listing based upon one of the optimization inputs related to the plurality of electrically powered vehicles operated by the plurality of customers selected from a planned customer destination for each of the plurality of customers, planned trip information for each of the plurality of customers, preference for each of the plurality of customers to certain hydrogen fuel feedstock, a customer subscription level for each of the plurality of customers, points of interest for each of the plurality of customers, saved favorite chargers for each of the plurality of customers, and minimum tolerable state of charge for each of the plurality of customers.

In some embodiments, the computerized server device programmed to determine the lowest-cost-based ranked listing of matched charger and vehicle pairings for each of the plurality of customers includes the computerized server device being programmed to maximize fuel efficiency of the plurality of available mobile chargers.

In some embodiments, the computerized server device programmed to determine the lowest-cost-based ranked listing of matched charger and vehicle pairings for each of the plurality of customers includes the computerized server device being programmed to minimize financial cost to the plurality of customers.

In some embodiments, the computerized server device programmed to determine the lowest-cost-based ranked listing of matched charger and vehicle pairings for each of the plurality of customers includes the computerized server device being programmed to minimize traffic congestion around the plurality of available mobile chargers.

In some embodiments, the computerized server device is further programmed to schedule wait line queues for each of the plurality of available mobile chargers. In some embodiments, the computerized server device programmed to schedule the wait line queues for each of the plurality of available mobile chargers includes the computerized server device being programmed to determine charging needs of each vehicle in the wait line queues. In some embodiments, the computerized server device programmed to schedule the wait line queues for each of the plurality of available mobile chargers includes the computerized server device being programmed to determine urgency-related factors of each vehicle in the wait line queues. In some embodiments, the computerized server device programmed to schedule the wait line queues for each of the plurality of available mobile chargers includes the computerized server device being programmed to comply with fast charge requirements of the customers. In some embodiments, the computerized server device programmed to comply with fast charge requirements of the customers includes the computerized server device being programmed to balance power at a plurality of charging tethers of a charger. In some embodiments, the computerized server device programmed to schedule the wait line queues for each of the plurality of available mobile chargers includes the computerized server device being programmed to comply with accelerated charge requirements of the vehicles. In some embodiments, the computerized server device programmed to comply with accelerated charge requirements of the vehicles includes the computerized server device programmed to balance power at a plurality of charging tethers of a charger.

In some embodiments, the computerized server device programmed to direct each of the plurality of customers to the desired charger for the customer includes the computerized server device being programmed to generate a map display showing a location of the desired charger.

According to one alternative embodiment, a computerized system for matching a plurality of electrically powered vehicles to a plurality of available mobile chargers includes a computerized server device. The computerized server device is programmed to monitor optimization inputs related to the plurality of available mobile chargers, monitor optimization inputs related to the plurality of electrically powered vehicles operated by a plurality of customers, determine a lowest-cost-based ranked listing of matched charger and vehicle pairings for each of the plurality of customers based upon the optimization inputs related to the plurality of available chargers and the optimization inputs related to the plurality of the electrically powered vehicles, present the ranked listing of matched charger and vehicle pairings for each of the plurality of customers to each of the customers, monitor selection by each of the plurality of customers of a desired charger for the customer from the ranked listing, direct each of the plurality of customers to the desired charger for the customer, schedule wait line queues for each of the plurality of available mobile chargers, determine patterns of use of the mobile chargers, and direct the plurality of available mobile chargers to new locations based upon the determined patterns of use.

According to another alternative embodiment, a computerized method for matching a plurality of electrically powered vehicles to a plurality of available mobile charger system includes, within a computerized server device, monitoring optimization inputs related to the plurality of available mobile chargers, monitoring optimization inputs related to the plurality of electrically powered vehicles operated by a plurality of customers, determining a lowest-cost-based ranked listing of matched charger and vehicle pairings for each of the plurality of customers based upon the optimization inputs related to the plurality of available chargers and the optimization inputs related to the plurality of the electrically powered vehicles, presenting the ranked listing of matched charger and vehicle pairings for each of the plurality of customers to each of the customers, monitoring selection by each of the plurality of customers of a desired charger for the customer from the ranked listing, and directing each of the plurality of customers to the desired charger for the customer.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIGS. 8A and 8B are a flowchart illustrating an exemplary process for directing each of a plurality of electric vehicles to each of a plurality of chargers according to the disclosed system, in accordance with the present disclosure;

DETAILED DESCRIPTION

Figure 1:
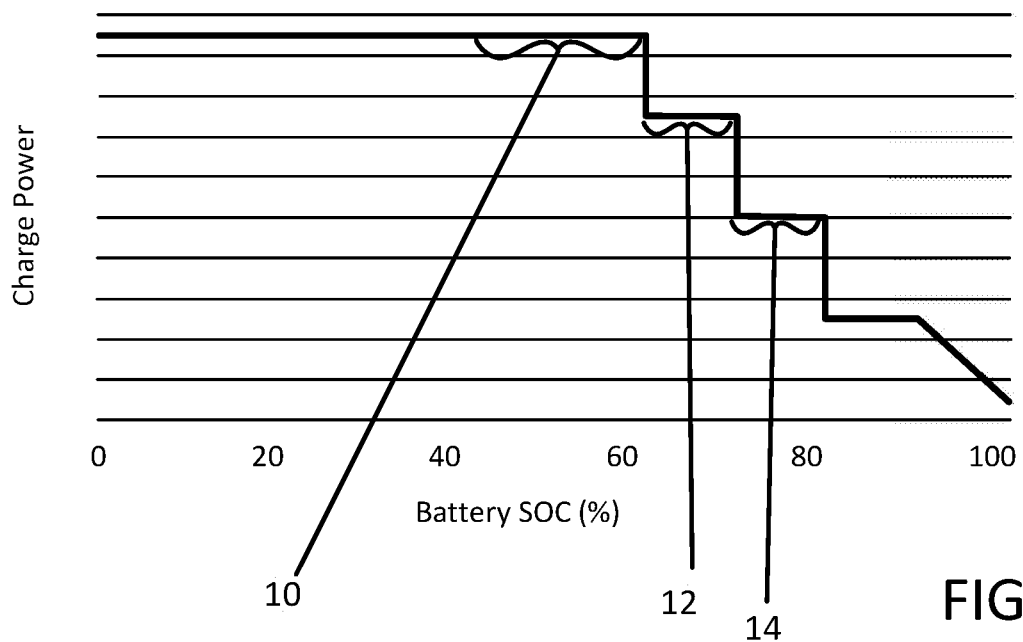
FIG. 1 illustrates exemplary direct current charging power utilized by a charger to charge a vehicle energy storage device versus percent state of charge for the vehicle energy storage device being charged, in accordance with the present disclosure.

Customers that utilize electric vehicles, whether they drive the vehicles or manage a fleet of vehicles, consider a maximum range of the electric vehicles. Fueling stations for traditional vehicles such as gasoline or diesel-powered vehicles are widely established. However, electric vehicle infrastructure such as rechargers operated from traditional sites with buildings and connections to the electric power grid (herein, fixed charging sites) are sparse. Investment costs to create such chargers may be prohibitive and the numbers of electric vehicles currently in use are small as compared to the total vehicle population. Further, potential customers evaluating electric vehicles for use or purchase may be daunted by range anxiety, concern over whether the vehicle has enough maximum range to be useful, sparsity of chargers along a desired travel route, and long changing times or charging queues at the available chargers. Challenges to existing charging strategies include high operating expenses, traffic congestion in areas with multiple chargers, and high customer decision complexity with existing charging price structure.

Mobile chargers may be employed to supplement fixed charging sites. An exemplary mobile charger may include a flat-bed-trailer equipped with one or more fuel cell stacks operable to convert stored fuel, for example, hydrogen gas, into electrical energy useful to charge energy storage devices on vehicles. By utilizing mobile chargers, customers may be provided with additional options for recharging electric vehicles, including more convenient, more financially cost effective, less time consuming, and generally more adaptive options for charging energy storage devices of electric vehicles. Mobile chargers may include platforms based upon energy battery technology, combination energy battery and fuel cell technology, or fuel cell technology. Mobile chargers, for example, utilizing fuel cells, may provide a means to support a semi-long-term charging point (high demand location), may be moved with high demand point, or may go vehicle to vehicle with help of attendant or autonomous operation all being optimized via optimization software.

A real time optimization approach may be described utilizing infrastructure, status of infrastructure, and customer needs to determine a best mobile charging point for a customer or a plurality of customers. An algorithm is useful to optimally match customers, their vehicles and many potential chargers and present a prioritized list of potential matches to the customer. Such a prioritized list may be optimized by a wide variety of factors, which may include optimization inputs related to the plurality of available chargers, optimization inputs related to the electrically powered vehicle of the customer, optimization inputs related to preferences of the customer. Factors useful for optimizing the system may include location, cost, availability, duration, vehicle SOC, vehicle parameters such as a maximum charge rate, planned destination, available parking, time available to charge, etc.

Fuel cells enable zero emissions mobile battery electric vehicle chargers that may quickly relocate to react to customer demand. The disclosed system optimizes fuel consumption at a network level by algorithmic matching of customers to chargers.

The disclosed system may aid customers to find chargers according to the customer's preferences. In addition, the disclosed system may be used to enable mobile chargers that may optimize location based on historic and predicted use, price modulation to encourage network level system efficiency and reduce congestion, an ability to continuously arbitrate power between multiple customers at a station with fine resolution, and real-time network level system optimization of hydrogen fuel consumption by matching customers and vehicles to charge stations based on known, learned and estimated data.

In one exemplary use of the disclosed system, typical customer complexity of route planning and cost of fuel is reduced to a simple price per charge site using accessible data. The customer may retain ultimate choice to follow system recommendation or pay a higher price to charge anywhere they please, for example, paying a high price to recharge their electric vehicle closer to their intended route, at a convenient location, or at a location with shorter waiting times.

The disclosed system may be used to monitor typical traffic and the population's response to available chargers. Such historical data may be useful to provide suggested locations for mobile chargers. For example, based upon historical data, one may determine that during a morning rush hour for a particular locale, four mobile chargers should be placed along an east-bound lane of a highway going into a city and that during an afternoon rush hour, three mobile chargers should be placed along a west-bound lane of the same highway exiting the city. Similarly, the disclosed system may be used to predict need for chargers. For example, a schedule of events at a convention hall or at a sporting stadium may be used to predict increased traffic and resulting increased recharging needs along a particular roadway or road network.

The disclosed system may use price modulation to encourage customers to seek out chargers based upon efficiency factors for available chargers. For example, if a particular charger is overwhelmed with customers waiting to charge at that location, higher costs at that station and/or reduced costs at nearby alternative stations with less traffic may be used to encourage customers to utilize the alternative stations. Similarly, if a particular charger is low on hydrogen reserves or if the station for some reason has difficulty being refilled with hydrogen, higher costs at that station may be used to encourage customers to utilize alternative stations.

The disclosed system may be utilized to arbitrate power between multiple vehicles and customers with fine resolution. For example, a single charger may include multiple charging cables or connections for use by multiple vehicles in parallel. While the vehicles may be charged in parallel, the charger may provide a finite charging power to the vehicles. Different vehicles may have different charging needs. For example, a small passenger vehicle may include a small energy storage device, which may be relatively easily charged, while a large commercial truck may include a large energy storage device, which may be relatively difficult to charge. If both the passenger vehicle and the truck are provided with parallel and equal charging connections, the passenger vehicle will be done very quickly or be unable to accept the high power required by the truck, and the truck will take an unreasonably long time to charge. By providing a higher power to the truck than the passenger vehicle, both customers may be reasonably satisfied by the charging event. In another example, a first vehicle with a nearly completely charged energy storage device, seeking to top off the vehicle's energy storage device, and a second vehicle with a nearly completely de-charged energy storage device may be charged in parallel. While the first vehicle will have a short charging time with a reasonable charging power, the second vehicle with the greater charging need may include a significantly shorter charging time by providing that vehicle with a higher power from the charger. By providing a higher power to the vehicle with the greater charging need, the customer with that vehicle with the greater charging need may be satisfied with a shorter charging time while the customer with the vehicle seeking to be topped off may still be reasonably satisfied with a marginally increased charging time. The disclosed system may arbitrate power between multiple vehicles being charged simultaneously or in parallel, using the disparate power output between the multiple vehicles to increase or manage customer satisfaction. Customer and vehicle inputs may be used as important criteria in the disclosed system. In the customer selection of priorities, vehicle inputs may be used and may be part of the resulting selection for the customer. Through this if the customer selects to top off the vehicle in a shortest time available and agrees to pricing, he or she will get maximum priority at the charging side with the location meeting the charging needs. The next customer that is in the selection process immediately after the priority customer will have potentially reduced immediate options at that site until the priority customer is finished.

The disclosed system may additionally monitor and/or determine efficiency factors within a system including multiple chargers with multiple parts. The system may evaluate or tabulate efficiencies for each charger, and these efficiencies may be used in the disclosed algorithm as a factor for directing or matching vehicles with the chargers.

According to one exemplary embodiment, such efficiencies may be determined based on cost to startup/warm up/shutdown the fuel cell stack (FCS), cost to idle the FCS, level of energy or state of charge (SOC) in the system support battery, a level of energy in the thermal battery (measured as heat or temperature), local weather, solar or shade effect on heat rejection or collection, fuel level and the effort to exchange hydrogen supply at each site, and a number of reserved, prepaid or planned customers yet to arrive at that station. One of the parameters is the operating curves of the various subsystems. It is desirable to operate the battery and fuel cell within their peak efficiency conditions, knowing the requirements for overall system operation. Therefore, an operating strategy will incorporate a multitude of operating parameters and know performance behavior of the various sub-systems, to select operating points that maximize system efficiency.

Additionally, according to one exemplary embodiment, the customer may have an influence regarding where they prefer charge stations to be deployed at and see much faster reaction than would be experienced waiting for a new fixed charger to be built—days vs. years to deploy. Such an influence may be a literal vote or an automated decision using customer provided location/SOC/charging data to a central server. Additionally, according to one exemplary embodiment, the customer may have a choice in pricing, charge rate, and vehicle charging queue prioritization through selecting which charge site they visit, charging service memberships they enroll in, or in which vehicle model they purchase.

Accordingly, for private owner customers, the disclosed system provides enhanced access to chargers, providing an optimized, prioritized list of available chargers and promoting system efficiency. For fleet owners or autonomous vehicle fleets, in addition to minimizing fuel costs, the system also optimizes to maximize vehicle uptime and minimize detour from a last or next destination, promoting efficiency in vehicle charging and enabling a maximum number of vehicles to be mobile for a maximum duration.

In one embodiment, a lowest-cost-based algorithm useful within the disclosed system may be described as a ranked listing of the available chargers based upon one or more optimization inputs. This ranked listing may be provided to a single customer in a vehicle. The ranked listing of the available chargers may be simple, for example, based upon one of lowest cost, closest current distance from the vehicle, least deviation from a currently planned route, closest distance to a preferred charging location or locale, charging times, and charging queues. The ranked listing may be a more complex determination, for example, reducing cost, deviation from a currently planned route, and queue times each to a "cost factor value," adding these cost factor values, and ranking candidate chargers based upon the lowest total cost factor values for each station. Such ranked listings of the available chargers may be determined for each customer in isolation of a larger picture, for example, optimizing these values for the customer alone and without consideration for other drivers.

In one embodiment, a lowest-cost-based algorithm useful within the disclosed system may be described as a lowest-cost-based ranked listing of matched charger and vehicle pairings. Such matched charger and vehicle pairings may be comprehensive to customers using the provided optimization service. For example, during a heavy traffic event, the disclosed system may direct or urge customers needing chargers to different locations, balancing the direction based upon traffic congestion, available hydrogen fuel at the various stations, and queue times. Human customers driving vehicles may retain a power of choice, for example, electing to choose a second or third ranked charger on a provided ranked listing based upon user preferences. Automated vehicles may be automatically directed, for example, based upon negotiated factors between the owners of the automated vehicles and operators of the disclosed system, wherein the automated vehicles are charged at some minimum efficiency in exchange for a contracted price.

Lowest-cost-based algorithms disclosed herein may include input factors from multiple categories. Input factors may include optimization inputs related to a plurality of available chargers. Such inputs related to a charger may include a geographic location of the station, a fuel cell efficiency vs. load (hardware version, operating hours, abusive events), remaining hydrogen fuel and ease of replenishment, cost and/or forecast cost of hydrogen fuel for the station/fuel feedstock, electrical energy or SOC remaining in a rechargeable energy storage system for the charger, thermal energy remaining in a thermal buffer for the charger, an on/off state for the station, an off timer setting for the station, a temperature of each FCS within a station, a weather and/or solar forecast for the station, and predicted harvestable or rejectable energy available to the station.

Input factors may additionally or alternatively include optimization inputs related to the electrically powered vehicle. Such inputs related to an electrically powered vehicle may include a vehicle location relative to various chargers, vehicle parameters including a service history for the vehicle, vehicle history and energy usage history, vehicle brand, and a vehicle battery predicted charge profile.

Input factors may additionally or alternatively include optimization inputs related to preferences of the customer. Such inputs related to the preferences of the customer may include financial cost preferences, a planned customer destination, planned trip information, customer preference to certain hydrogen fuel feedstock (for example, a preference for renewably created hydrogen fuel), a customer subscription level (for example, good, better, and best ratings), customer points of interest near each charger, customer saved favorite stations, and customer minimum tolerable SOC (range courage/range anxiety.)

In one embodiment, inputs related to an electric vehicle and inputs related to the preferences of the customer operating that vehicle may be described as a single term, for example, with the term inputs related to the electric vehicle encompassing both inputs related to the vehicle itself and the preferences of the customer.

According to another exemplary embodiment of the algorithm of the present disclosure, a geographic location of a station, a remaining hydrogen fuel available at that station, an ease of replenishing the hydrogen fuel at that station, an electrical energy or SOC remaining in a renewable energy storage system of the station, a thermal energy remaining in a thermal buffer of the station, an on/off state of the station, an off timer of the station, and a temperature of each FCS of the station may be used to determine a cost to turn the charger back on from an off state including energy needed to warm the FCS and charge an onboard renewable energy storage system to make the station useable for recharging vehicles. This cost can, for example, be used in comparison to costs associated with routing vehicles through an already congested and partially depleted neighboring station in order to determine whether the station in the presently off state should be activated into an on state.

According to another exemplary embodiment of the algorithm of the present disclosure, a geographic location of a station, a fuel cell efficiency vs. load determination for the station, a cost and forecast cost of hydrogen fuel for the station, a weather and solar forecast and harvestable energy projection for the station, a vehicle brand, a vehicle battery predicted charge profile, and a customer subscription level may be used to determine a predicted charge profile and energy cost if a customer were to visit this station. Such a determination may be used to direct to or divert from the station based upon a cost comparison, for example, to a similar determination for neighboring stations.

According to another exemplary embodiment of the algorithm of the present disclosure, a geographic location of a station, a cost and forecast cost of hydrogen fuel for the station, a planned customer destination, planned trip information, a customer subscription level (for example, good, better, and best ratings), customer points of interest near each charger, and customer saved favorite stations may be used to determine customer interest level in using each station.

Each time a customer seeks out a charger, the matching algorithm may calculate each possible customer-vehicle-station combination efficiency to offer a price for each to maximize efficiency and minimize fuel used. The customer interface may provide user-directed filtering of matches based on saved preferences and present the customer with ranked options that could be sorted by price, distance or other factors.

In one embodiment, the system may continuously redistribute chargers and route customers away from high-traffic areas helping to avoid both traffic congestion and other delays. In another embodiment, the system may redistribute chargers based upon contractual agreements, such as proximity to hydrogen fuel supplier depots or retail locations seeking additional traffic. In another embodiment, the system may direct customers and distribute chargers based upon additional information, for example, based upon weekday vs. weekend traffic patterns.

FCS efficiency varies depending upon operating conditions. FCS efficiency describes how much hydrogen fuel is used to generate a given amount of energy for use in charging vehicles. According to one exemplary embodiment of the disclosed system, the system may maximize efficiency of a network of chargers by permitting the system to operate in peak efficiency ranges. Vehicles may be directed to charging stations operating in peak efficiency ranges or lower efficiency of the chargers may be a cost utilized in a lowest-cost-based algorithm used to statistically guide more vehicles to chargers operating near peak efficiency.

FIG. 1 illustrates direct current charging power utilized by a charger to charge a vehicle energy storage device versus percent state of charge for the vehicle energy storage device being charged. The vertical axis describes charging power of the charger as a percentage of maximum charge rate. The horizontal axis describes energy storage device SOC as a %. The plot illustrated describes an exemplary fast charge cycle that may be controlled through the charger to recharge the energy storage device. High power is utilized to charge the energy storage device when the SOC is below 50%. Above 50%, the charging cycle is controlled in three step reductions to reduce charging power. An exemplary DC fast charge protocol such as the one illustrated may accommodate holding a constant power for an extended time. Three periods of relative constant charging power are illustrated as reference points 10, 12, and 14 respectively. Efficiency of the system may be evaluated relatively easily during these periods of constant power, permitting the disclosed system to compare operation of a plurality of chargers and assign costs for using each accordingly. Measuring FCS system efficiency in one exemplary embodiment may be achieved by monitoring fuel consumed and electricity produced. The supervisory matching system may then use this method to continuously measure and update the stored efficiency curve for each system in its geographic optimization region. By using the measured fuel cell efficiency for each charger to make the system level optimizations instead of using modeled or predicted efficiency we expect to better optimize at a system level. It will be understood that the specifics of the battery charging scheme and the particular values illustrated are exemplary and can vary from system to system.

Figure 2:
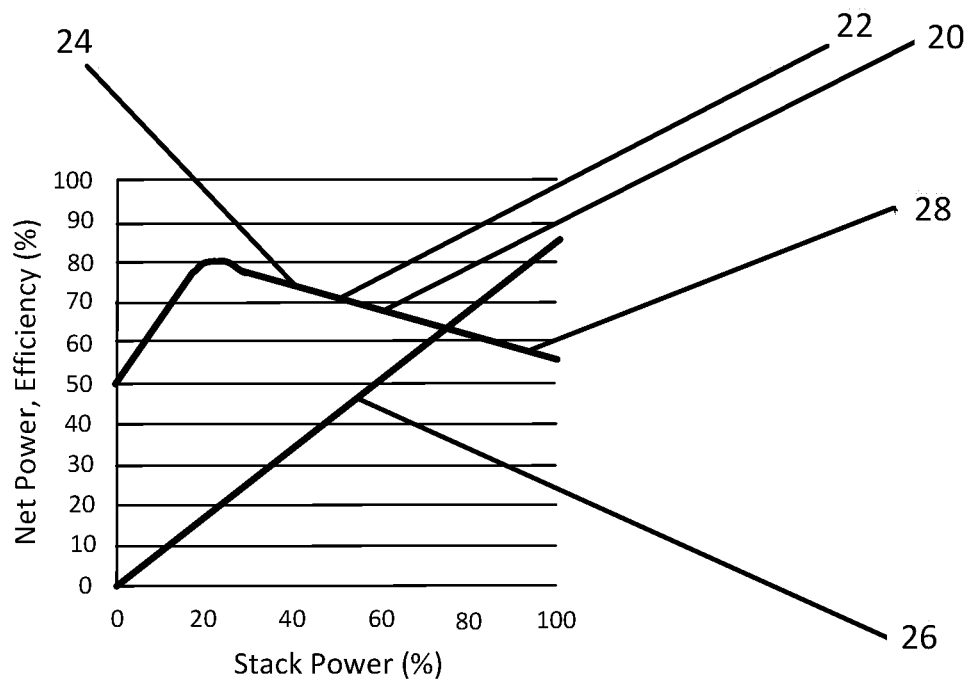
FIG. 2 illustrates exemplary fuel cell stack efficiency as a function of fuel cell stack power, in accordance with the present disclosure.

FIG. 2 illustrates FCS efficiency as a function of fuel cell stack power. The vertical axis on describes FCS net power as a percent of rated stack power. The vertical axis additionally describes FCS efficiency for a given stack power value. The horizontal axis describes stack power as a percent of rated stack power. Plot 26 illustrates values that may be measured of FCS net power for a stack power value. A difference between fuel cell net power and stack power is a cost of power production or auxillary loads to the fuel cell system. By comparing FCS net power to stack power, an efficiency curve may be plotted as plot 28. The system optimization function requires FCS efficiency as an input. Different chargers with different hardware, different historical hours of operation, different temperatures, different fuel cell stacks, etc., will have different efficiency curves. Points of plot 28 at reference points 20, 22, and 24 represent data points regenerated by measurements taken in periods represented by reference points 10, 12, and 14 of FIG. 1, respectively. Such points may be used to interpolate an overall efficiency of a specific charger. By generating an efficiency curve such as plot 28 for each of a plurality of chargers or FCSs, the disclosed system may compare operation of a plurality of chargers and assign costs for using each accordingly.

According to another exemplary embodiment, the disclosed system may input customer or other preferences related to fuel feedstock preference. Fuel such as hydrogen fuel may be generated in a number of ways. Customers, fleet owners, and other entities may prefer one source of fuel stock over others. For example, a customer may have a strong preference for fuel created by renewable sources such as wind and solar. Other customers may prefer fuel created by natural gas or hydro-electric plants. The disclosed system may evaluate and assign costs based upon the availability, cost, and preference of the customer for fuel feedstock preferences.

According to another exemplary embodiment, customer subscription levels may be utilized to evaluate options and assign costs for a lowest-cost-based algorithm. A customer may purchase an exemplary good, better, or best grade membership as offered by the operator of the disclosed system, for example, earning accelerated or reserved places in waiting queues, reduced algorithmic costs for chargers close to a desired route, reduced fuel prices, or other benefits for purchasing a higher grade subscription plan.

According to another exemplary embodiment, customer minimum tolerable SOC (range courage/range anxiety) may be utilized by the disclosed system to evaluate options and assign costs for a lowest-cost-based algorithm. One exemplary customer may be willing to accept a minimum energy storage device SOC of 10 to 15% without significant anxiety. Another exemplary customer may be willing to accept a minimum energy storage device SOC of 40%. Distance of each of a plurality of chargers from a vehicle's present location and projected or predicted SOC remaining when the vehicle arrives at each of the chargers may be used to evaluate chargers and assign costs by the disclosed system.

The disclosed system may additionally perform a system level assessment of fuel per charger in a network of chargers, for example, monitoring how much fuel remains in each charger. The system may further monitor scheduled fuel delivery dates for each charger. Planned station refuel events and expected consumption—commuting corridor with rush hour approaching. High traffic on Friday/Sunday for weekends. Expected approach of high customer volume The disclosed system may monitor or alternatively control charger network level percent active station target per time of day and per day of week. For example, the disclosed system may perform its functions of determining costs and utilizing the disclosed algorithm to direct vehicles to various chargers in the network. However, if costs within a portion of the algorithm reflecting charger scarcity or queue wait times become too costly, impacting the direction of vehicles past a determined threshold, the system may request or direct activation of one or more dormant or turned off chargers. Customers may be prevented or discouraged from visiting chargers in an off state.

Figure 3:
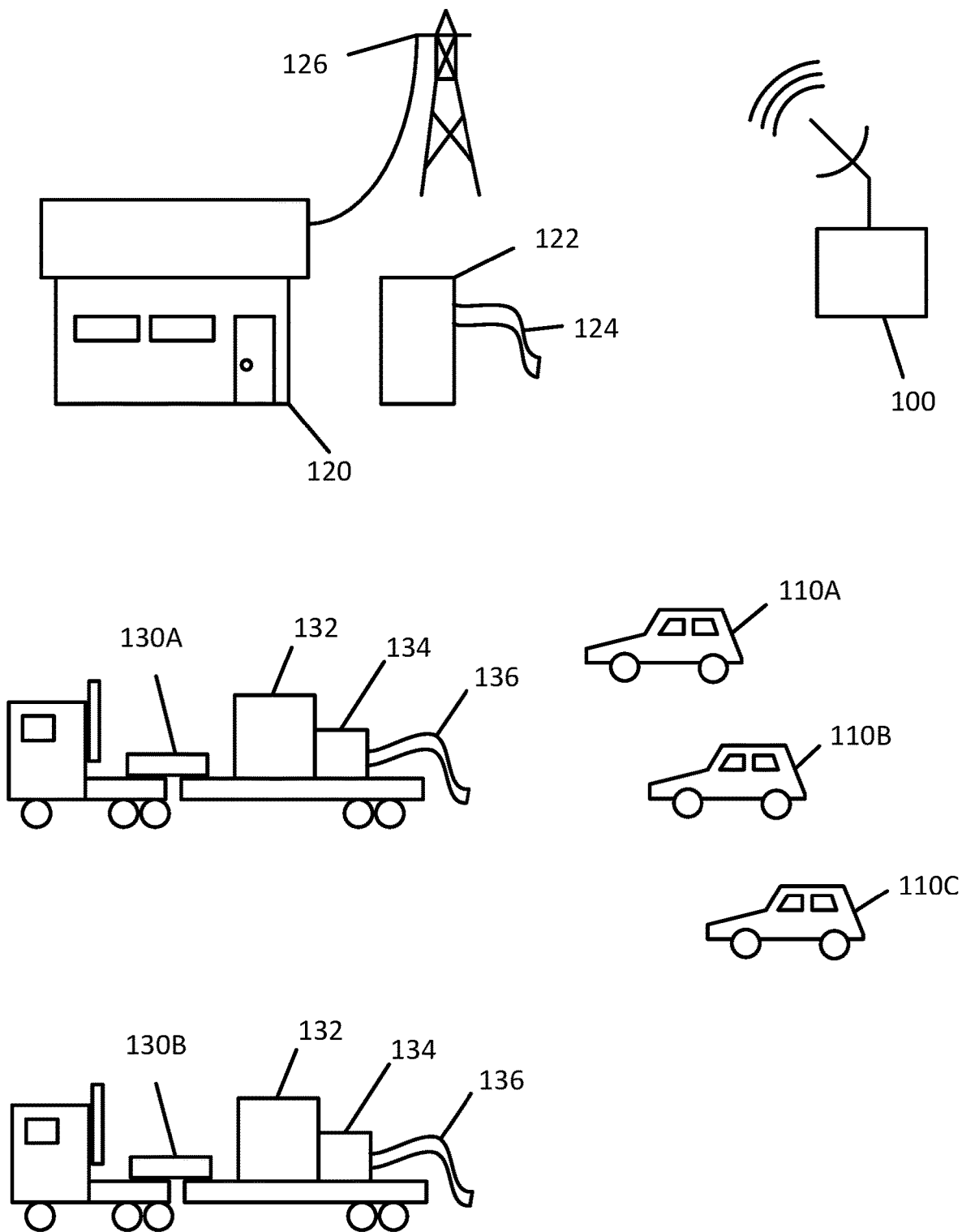
FIG. 3 illustrates an exemplary plurality of vehicles, an exemplary plurality of chargers, and an exemplary remote server device operable to operate the disclosed system, in accordance with the present disclosure.

FIG. 3 illustrates an exemplary plurality of vehicles, an exemplary plurality of chargers, and an exemplary remote server device operable to operate the disclosed system. Electric vehicles 110A, 110B and 110C are illustrated, each including an on-board energy storage device which may be recharged as each vehicle depletes the energy stored in the respective energy storage device. A fixed charger 122 is illustrated, including a connection to a power grid electric system 126. Fixed charger 122 may include a permanent building 120 representative of a location permanently in the business of charging vehicles. Fixed charger 122 includes charging tether 124 operable to attached to a charging port on each of vehicles 110A, 110B, and 110C. Two mobile chargers 130A and 130B are illustrated, each including a fuel tank 132, a fuel cell stack 134, and a charging tether 136. It will be appreciated that one of the mobile chargers could be equipped with alternate charging hardware, for example, including an internal combustion engine, a battery energy storage device, a fuel cell-based charger with power electronics, or a fuel cell with energy-based battery and power electronics. Electric vehicles 110A, 110B, and 110C and chargers 122, 130A, and 130B are illustrated in proximity to each other for purposes of the illustration, however, it will be understood that each vehicle and charger may be many kilometers from each other. Remote server device 100 is illustrated in wireless or other communication with each of the vehicles and each of the chargers, and remote server device 100 includes programming operable to operate the system disclosed herein. FIG. 3 is an exemplary collection of vehicles, chargers, and a remote server. Many different collections of vehicles, chargers, and computerized devices are envisioned that could similarly accomplish the disclosed system, and the disclosure is not intended to be limited to the examples provided herein.

Figure 4:
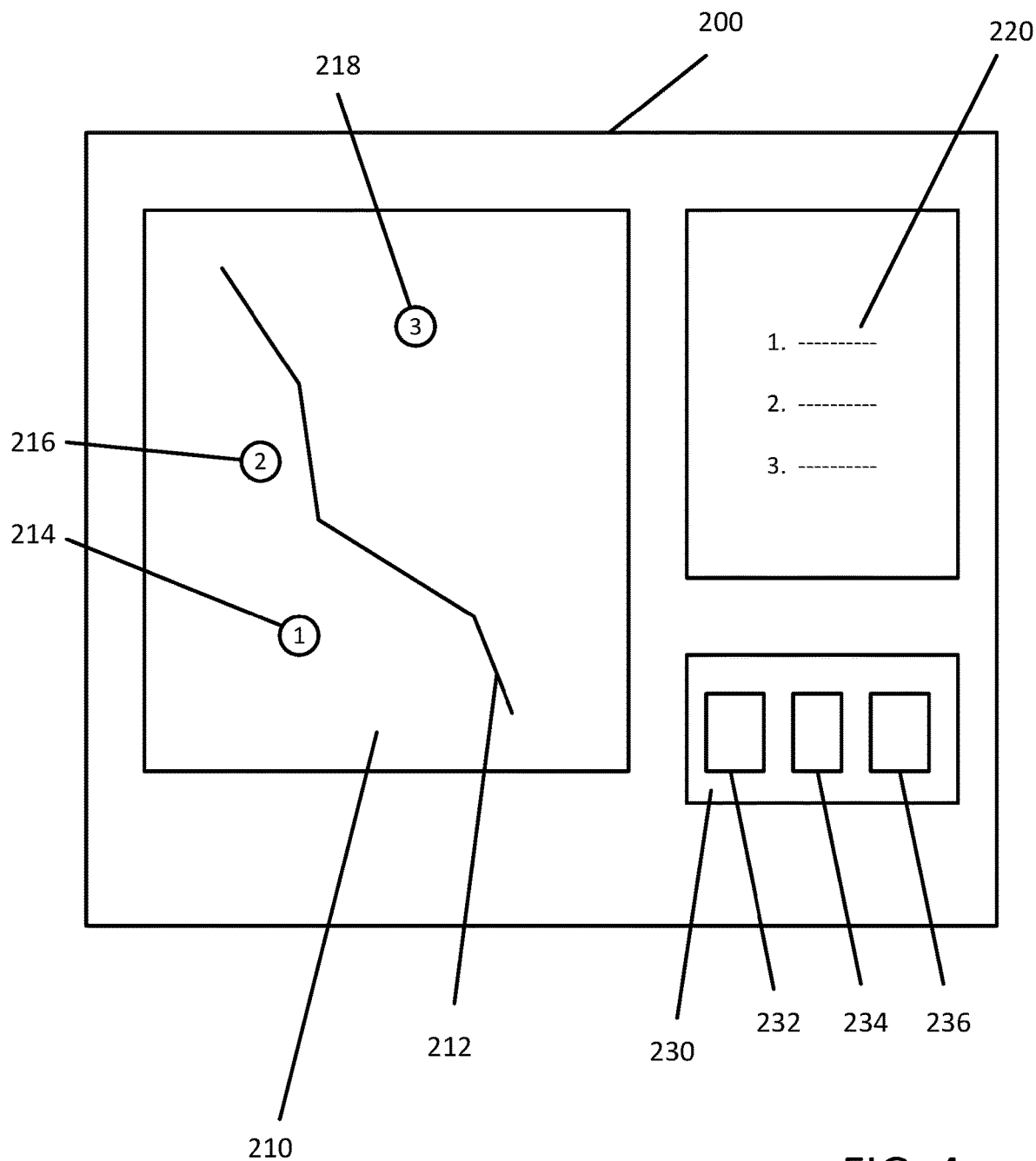
FIG. 4 illustrates an exemplary graphical display that may be used to present an output of a ranked listing to a customer in a vehicle, such that the customer may select a charger to be directed to, in accordance with the present disclosure.

FIG. 4 illustrates an exemplary graphical display that may be used to present an output of a ranked listing to a customer in a vehicle, such that the customer may select a charger to be directed to. Graphical display 200 may be located in a vehicle used by a customer, or graphical display may be viewed by an owner operator of an autonomous vehicle or vehicle fleet. Graphical display 200 may be located on an in-vehicle display, an in-vehicle touch screen display, a smart phone display, or other similar computerized display capable of presenting graphical information to a customer or operator. The customer or operator may be provided with an input device, whether the graphical display 200 is a touch-screen display capable of receiving inputs directly from the customer or operator or the customer is presented with buttons, a mouse, a joystick, a voice input, or other input device in the art.

Graphical display 200 may include a map display 210, which may include a navigational map display in the art, which may include a current location of the vehicle, a planned route 212, other road markings, town locations, points of interest, etc. Map display 210 further includes charger locations 214, 216, and 218 which correspond to a list of available chargers 220 which have been ranked based upon a ranked listing according to the system of the disclosure. Customer input panel 230 include buttons 232, 234, and 236 which are operable to permit input by the customer, and may include functionality such as selecting one of the available chargers to schedule a charging event, re-planning the planned route to direct the customer to the location of one of the available chargers, filtering the results of the ranked listing, making inquiries to specifics of one of the available chargers, for example, querying a recharge price, a fast charge capability, a waiting time for a waiting queue, other relevant information. Once a customer has selected a desired charger as a charger to be utilized to recharge the vehicle, the map display 210 may include a graphic indicating a location of the desired charger upon the map details. Graphical display 200 is exemplary, a number of different display configurations and display contents are envisioned, and the disclosure is not intended to be limited to the examples provided.

Figure 5:
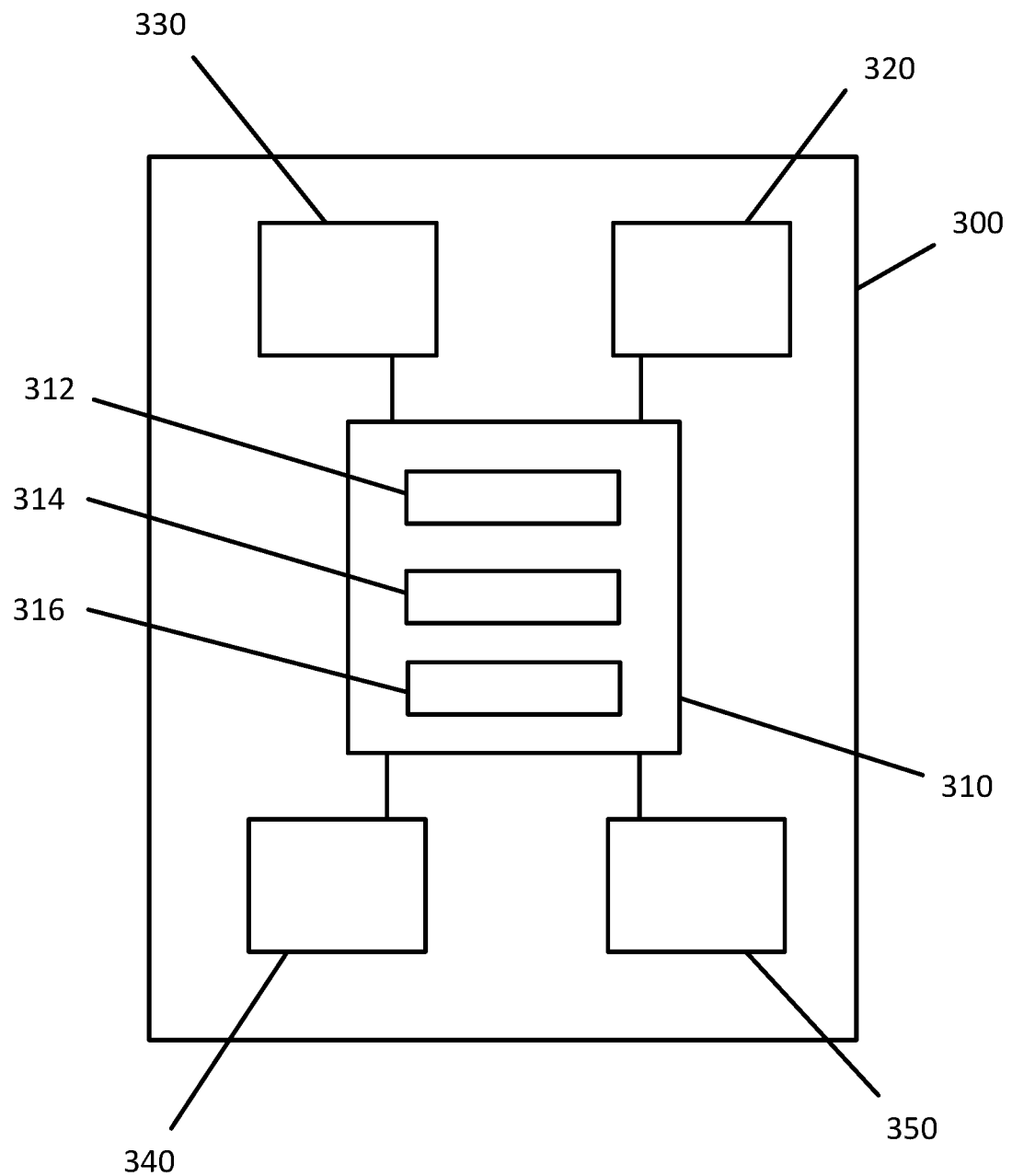
FIG. 5 illustrates an exemplary vehicle direction control module operating the disclosed system including a computerized processor, in accordance with the present disclosure.

FIG. 5 illustrates an exemplary vehicle direction control module operating the disclosed system including a computerized processor. Vehicle direction control module 300 may include processing device 310 operable to operate computerized programming. In the illustrative embodiment illustrating optional features of the disclosed system, vehicle direction control module 300 includes a processing device 310, a user interface 330, communication device 320, a memory device 350, a global positioning system (GPS) 340. It is noted that the vehicle direction control module 300 may include other components and some of the components are not required according to the disclosure.

The processing device 310 may include memory, e.g., read only memory (ROM) and random-access memory (RAM), storing processor-executable instructions and one or more processors that execute the processor-executable instructions. In embodiments where the processing device 310 includes two or more processors, the processors may operate in a parallel or distributed manner. The processing device 310 may execute the operating system of the vehicle direction control module 300. Processing device 310 may include one or more modules executing programmed code or computerized processes or methods include executable steps. Illustrated modules may include a single physical device or functionality spanning multiple physical devices. In the illustrative embodiment, the processing device 310 also executes server interface module 312, a user display and input screen control module 314, and a vehicle system interface module 316, which are described in greater detail below.

The user interface 330 is a device that allows a user to interact with the vehicle direction control module 300. While one user interface 330 is shown, the term "user interface" may include, but is not limited to, a touch screen, a physical keyboard, a mouse, a microphone, a speaker, and other user interface devices in the art.

The communication device 320 may include a communications/data connection with a vehicle bus device operable to transfer data to different components of the vehicle and may include one or more wireless transceivers for performing wireless communication.

The memory device 350 is a device that stores data generated or received by the vehicle direction control module 300. The memory device 350 may include, but is not limited to, a hard disc drive, an optical disc drive, and/or a flash memory drive.

The GPS 340 determines a location of the vehicle direction control module 300 by communicating with a plurality of GPS satellites. The GPS 340 may perform triangulation techniques to determine the GPS coordinates of the vehicle direction control module 300. It should be appreciated that while a GPS 340 is shown, another suitable component or device useful in the art for determining the location of the vehicle such as cell phone tower triangulation may be implemented.

According to one exemplary embodiment of the disclosure, methods and processes of the disclosed system may be executed by a remote server device in communication with vehicles, chargers, and other system resources through a communication network, such as the Internet. Server interface module 312 may receive and transmit information to and from a remote server operating the disclosed system and coordinates data for presentation and selection by the customer operating the vehicle or the system autonomously controlling the vehicle. Server interface module 312 may include computerized logic such as filters that may be applied to information received from the remote server, for instance, permitting the customer to remove choices presented by the remote server that do not match preferences of the customer.

User display and input screen control module 314 may be operable to coordinate presenting graphical information to the customer, for example, including a map display, display details regarding a plurality of chargers, and options for selection by the customer through user interface 330. User display and input screen control module 314 may further be operable to monitor selection by the customer of options, for example, including touch screen inputs to options presented upon the display of user interface 330.

Vehicle system interface module 316 may be operable to monitor data from various vehicular systems, for example, including a status of an energy storage device, operation of electric machines driving the vehicle including energy consumption data, navigation data entered by the customer into vehicle guidance systems, vehicle speed, and environmental data such as temperatures and weather. Vehicle system interface module 316 may provide data to the remote server through server interface module 312 and may provide data for local, in vehicle calculations.

Vehicle direction control module 300 is provided as a non-limiting example of a vehicular system useful to accomplish the disclosed system through coordination of an onboard computerized device with a remotely operated server device. Vehicle direction control module 300 is exemplary, many alternative embodiments of such a control module are envisioned, and the disclosure is not intended to be limited to the example provided.

Figure 6:
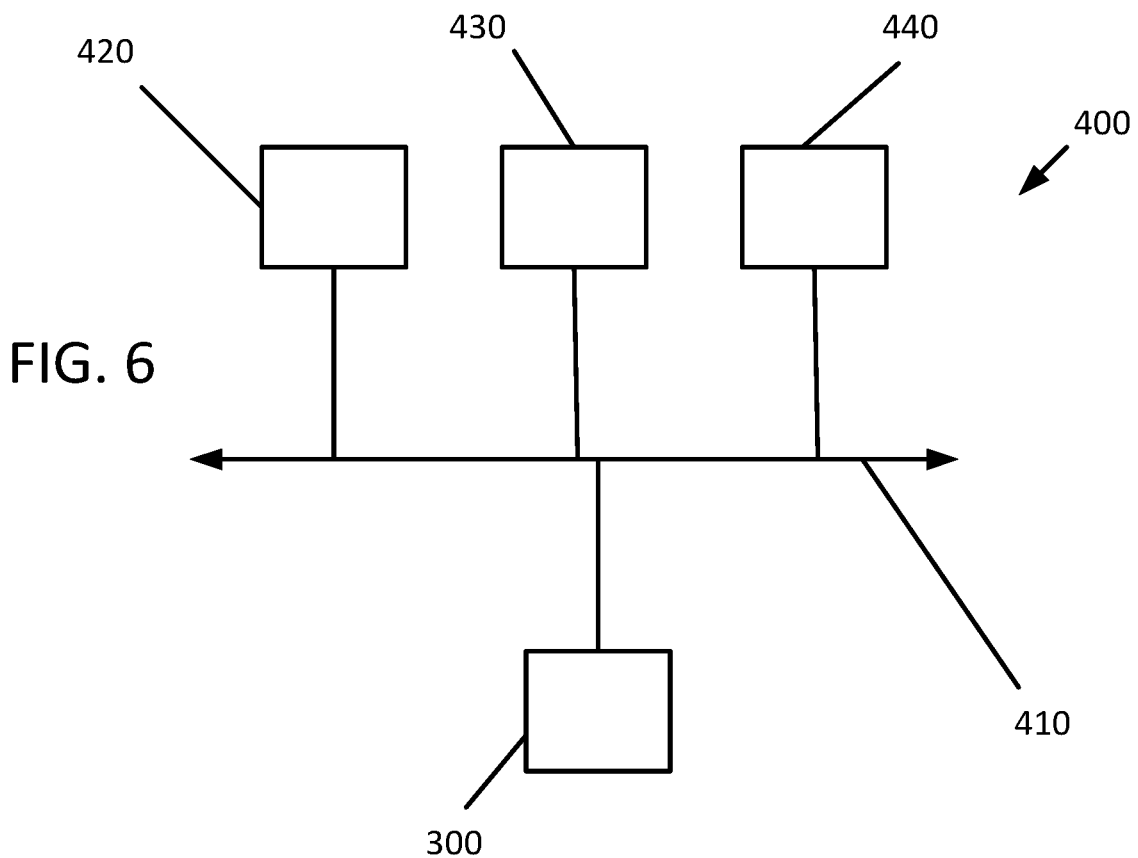
FIG. 6 illustrates an exemplary vehicle data communication and control architecture operable to provide information necessary to the vehicle direction control module in accordance with an embodiment of the disclosed system, in accordance with the present disclosure.

FIG. 6 illustrates an exemplary vehicle data communication and control architecture operable to provide information to the vehicle direction control module in accordance with an embodiment of the disclosed system. Vehicle data communication and control architecture 400 is illustrated including various vehicular devices in communication with vehicle data bus 410. Vehicle data bus 410 includes a communicative device in the art for providing for data communication easily between different computerized systems or devices. Vehicle direction control module 300 is illustrated connected to and in communication with vehicle data bus 410. Exemplary vehicle devices additionally illustrated connected to and in communication with vehicle data bus 410 include electric machine controller 420 controlling the propulsion system of the vehicle, energy storage device controller 430 monitoring and controlling a vehicle energy storage device, and regenerative and generative energy controller 440 controlling regenerative devices, such as regenerative brakes, and generative device, such as solar panels, upon the vehicle. The various vehicle devices provide data to vehicle direction control module 300, for example, enabling computation of a vehicle range and providing data and options related to the disclosed system. Vehicle data communication and control architecture 400 as illustrated is provided as a non-limiting example of vehicular systems, several different vehicle data communication and control architectures are envisioned, and the disclosure is not intended to be limited to the examples provided.

Figure 7:
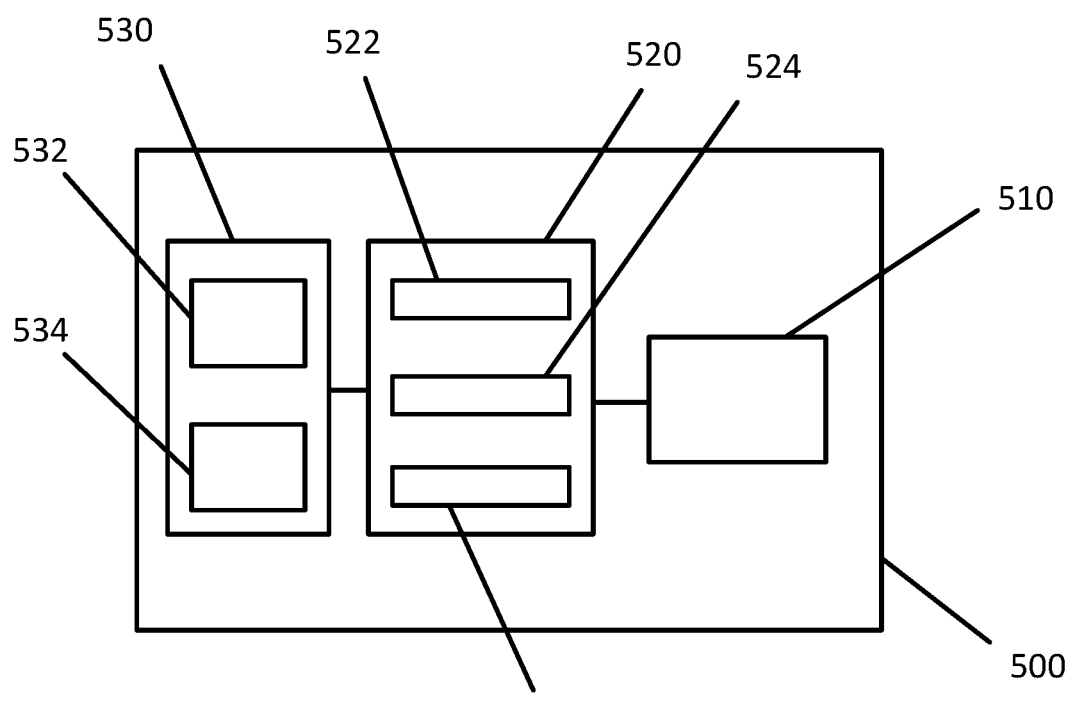
FIG. 7 illustrates an exemplary remote server device useful to operate the disclosed system, in accordance with the present disclosure.

FIG. 7 illustrates an exemplary remote computerized server device useful to operate the disclosed system. Server device 500 is illustrated including communications device 510, processing device 520, and memory device 530. Communications device 510 may include a communications/data connection operable to send and receive data over a communications network, such as the Internet, and may include one or more wireless transceivers for performing wireless communication.

Processing device 520 is operable to operate computerized programming. The processing device 520 may include memory, e.g., read only memory (ROM) and random-access memory (RAM), storing processor-executable instructions and one or more processors that execute the processor-executable instructions. In embodiments where the processing device 520 includes two or more processors, the processors may operate in a parallel or distributed manner. The processing device 520 may execute the operating system of the server device 500. Processing device 520 may include one or more modules executing programmed code or computerized processes or methods include executable steps. Illustrated modules may include a single physical device or functionality spanning multiple physical devices. In the illustrative embodiment, the processing device 520 also lowest-cost-based algorithm module 522, charger inputs module 524, and electric vehicle inputs module 526. Lowest-cost-based algorithm module 522 includes programming to execute the matching/lowest-cost-based algorithm disclosed herein and provide outputs to various customer vehicles and chargers in communication with server device 500. Charger inputs module 524 coordinates determination of various inputs related to the plurality of available chargers. Electric vehicle inputs module 526 coordinates determination of various inputs related to the a plurality of electric vehicles and customers or owner/operators of the plurality of vehicles utilizing the disclosed process.

The memory device 530 is a device that stores data generated or received by the processing device 520. The memory device 530 may include, but is not limited to, a hard disc drive, an optical disc drive, and/or a flash memory drive. Memory device 530 is illustrated including exemplary databases, including a charger database 532 and a customer vehicle database 534. Charger database 532 may store and provide access to information related to chargers, determined efficiencies, hydrogen storage history, locations, and other information relative to the disclosed system. Customer and vehicle database 534 may store and provide access to information related to customers, customer preferences, customer vehicles, including location data, vehicle model information, and vehicle efficiency information, and customer subscription data.

Server device 500 is provided as a non-limiting example of a computerized remoted server device useful to accomplish the disclosed system. Server device 500 is exemplary, many alternative embodiments of such a control module are envisioned, and the disclosure is not intended to be limited to the example provided.

Figure 8B:
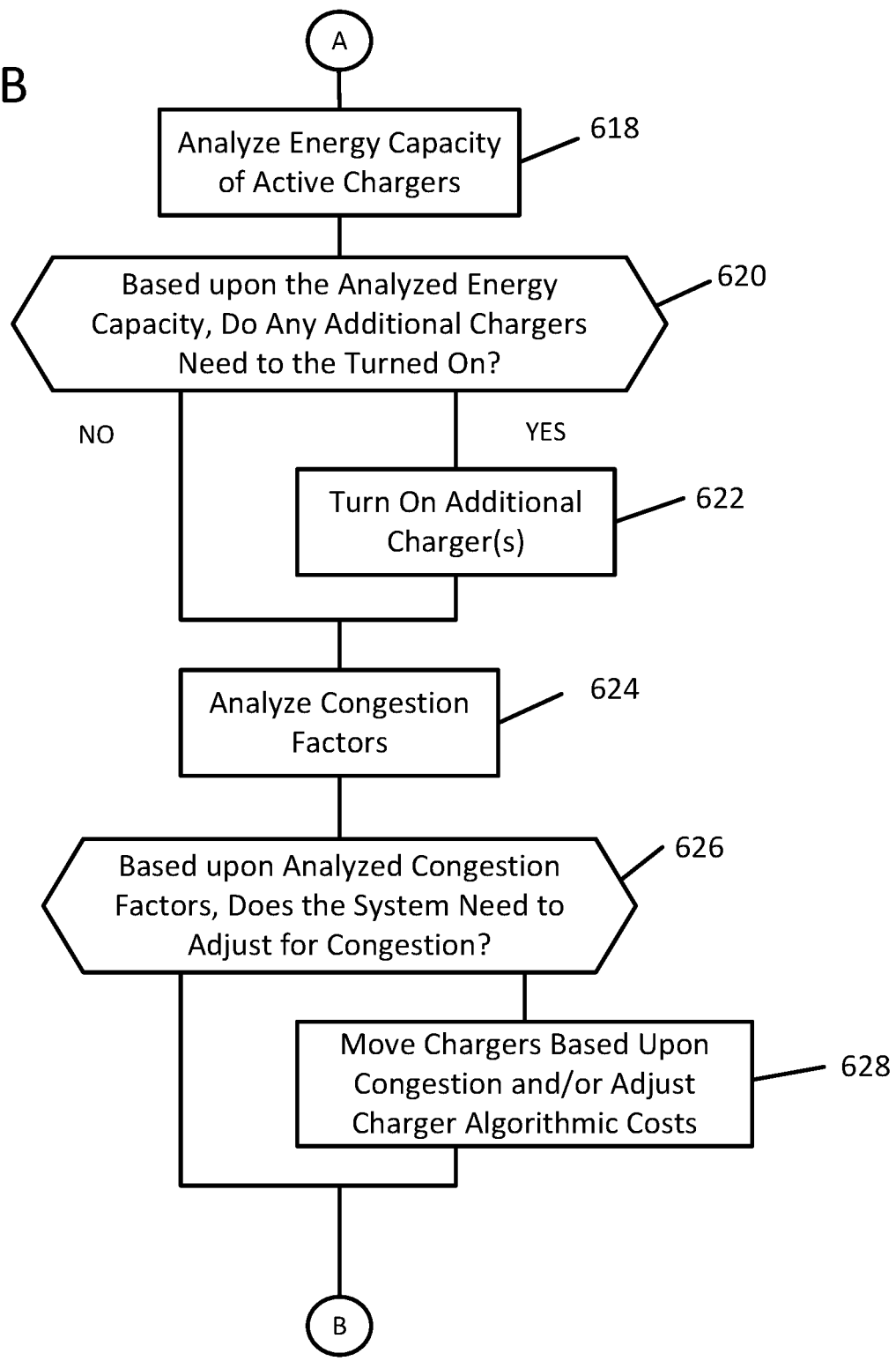

FIGS. 8A and 8B are a flowchart illustrating an exemplary process for directing each of a plurality of electric vehicles to each of a plurality of chargers according to the disclosed system. Process 600 starts at step 602. At step 604, the system acquires data related to a plurality of chargers available to the system. At step 608, the system acquires data related to a plurality of customer vehicles utilizing the system. Step 608 may include acquiring data regarding the customers (preferences, subscription levels, etc.) and may include acquiring data regarding the vehicles (vehicle brand, SOC, location, etc.)

Process 600 directs each of a plurality of customers to chargers utilizing a lowest-cost-based algorithm to generate a ranked listing for each of the customers. Steps 610A, 612A, 614A, and 616A illustrate a process whereby the system, for a first customer, determines a desired set of input parameters for the lowest-cost-based algorithm to use, determining algorithmic costs related to sending the customer to each of the plurality of chargers, performing the lowest-cost-based algorithm to generate the ranked listing for that customer, monitoring selection of a desired charger by the customer, and directing the customer to the desired charger. Selection of which input parameters to use may be set by the system operator, for example, maximizing effective use of fuel stocks available, reducing traffic congestion, or minimizing recharging costs. Selection of input parameters may be set by the customer or fleet operator, for example, selecting a shortest wait, a lowest cost, a most direct path to a desired route destination, or a most environmentally friendly fuel source. Steps 610B, 612B, 614B, and 616B similarly illustrate steps to provide a ranked listing to a second customer for selection of a desired charger, and steps 610C, 612C, 614C, and 616C similarly illustrate steps to provide a ranked listing to some other customer for selection of a desired charger. It will be appreciated that such a plurality of steps may be performed in parallel for a number of customers. According to one embodiment, once a customer has a real time reservation with a charger, data regarding that reservation may be fed back into the system for use in updating or informing the pending decisions of other subsequent customers.

At step 618, the system analyzes an energy capacity for each active charger in the plurality of chargers. At step 620, the system determines whether, based upon the analyzed energy capacity, additional chargers need to be activated or turned on. If additional chargers are not needed, the process advances to step 624. If additional chargers are needed, the process advances to step 622, where at least one additional charger is activated, and then the process advances to step 624. At step 624, the system analyzes congestion factors. At step 626, based upon the analyzed congestion factors, the system determines whether it needs to adjust for congestion. If the system does not need to adjust for congestion, the process returns to step 604 to reiterate the process of directing additional vehicles to the plurality of chargers. If the system does need to adjust for congestion, the process advances to step 628, where the system may command chargers to move to new locations to reduce congestion in certain areas and/or adjust charger algorithmic costs to direct vehicles away from congested areas. After step 628, the process returns to step 604 to reiterate the process of directing additional vehicles to the plurality of chargers. Process 600 is exemplary, several processes for operating a lowest-cost-based algorithm for directing vehicles to a plurality of charging stations are envisioned, and the disclosure is not intended to be limited to the examples provided.

Figure 9:
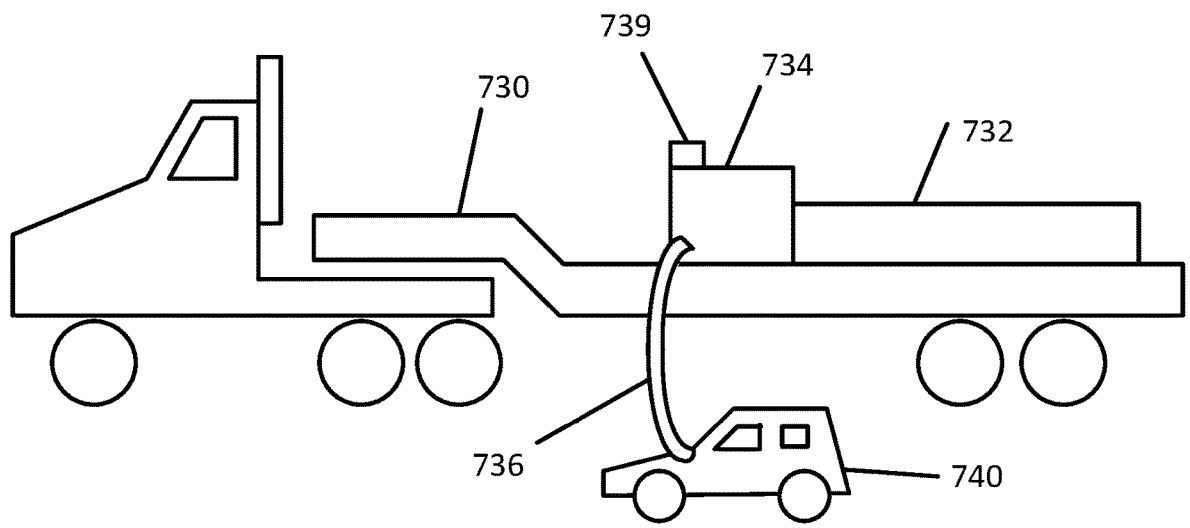
FIG. 9 illustrates an exemplary mobile charger providing a charge to an exemplary electric vehicle, in accordance with the present disclosure.
Figure 10:
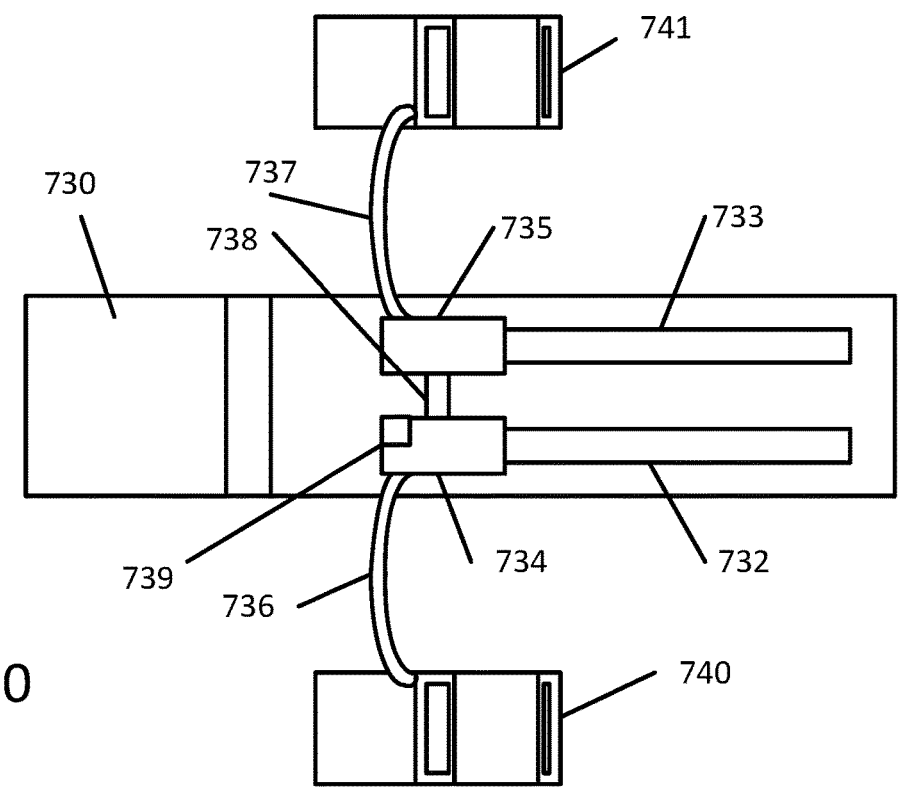
FIG. 10 illustrates the mobile charger of FIG. 9 from a top view, in accordance with the present disclosure.

FIG. 9 illustrates an exemplary mobile charger providing a charge to an exemplary electric vehicle. Mobile charger 730 is illustrated, including hydrogen tank 732, fuel cell 734, charging tether 736, and charger control device 739. It will be appreciated that the mobile charger could be equipped with alternate charging hardware, for example, including an internal combustion engine, a battery energy storage device, a fuel cell-based charger with power electronics, or a fuel cell with energy-based battery and power electronics. Tether 736 is illustrated connected to electric vehicle 740. FIG. 10 illustrates the mobile charger of FIG. 9 from a top view. Exemplary mobile charger 730 includes two separate hydrogen tanks 732 and 733, two separate fuel cells 734 and 735, and two separate charging tethers 736 and 737. Charging tethers 736 and 737 are illustrated connected to and providing charge to vehicles 740 and 741, respectively. Depending on mobile charger capability and charge rate options one mobile charger could have multiple charging tethers with all active or not dependent on customers connected and agreed charge rate (time and cost). It will be appreciated that a number of separate fuel cells and associated equipment may be used, for example, to provide multiple tethers for charging vehicles simultaneously. In one example, mobile charger 730 may include limited hydrogen fuel supply but may be operable to receive in-process refueling of the on-board fuel supply from a nearby second truck-based tank or from an infrastructure tank. Charger control device 739 may be visible or may be located internally, for example, within a casing of either fuel cell 734 and 735. Fuel cell bridge 738 is illustrated including electrical connection between the fuel cells and enabling charger control device 739 to control and modulate power provided to vehicles 740 and 741, for example, to provide a higher power to one than the other, managing energy available from both fuel cells 734 and 735. Mobile charger 730 is exemplary, a number of different mobile charger configurations are envisioned, and the disclosure is not intended to be limited to examples provided.

Figure 11A:
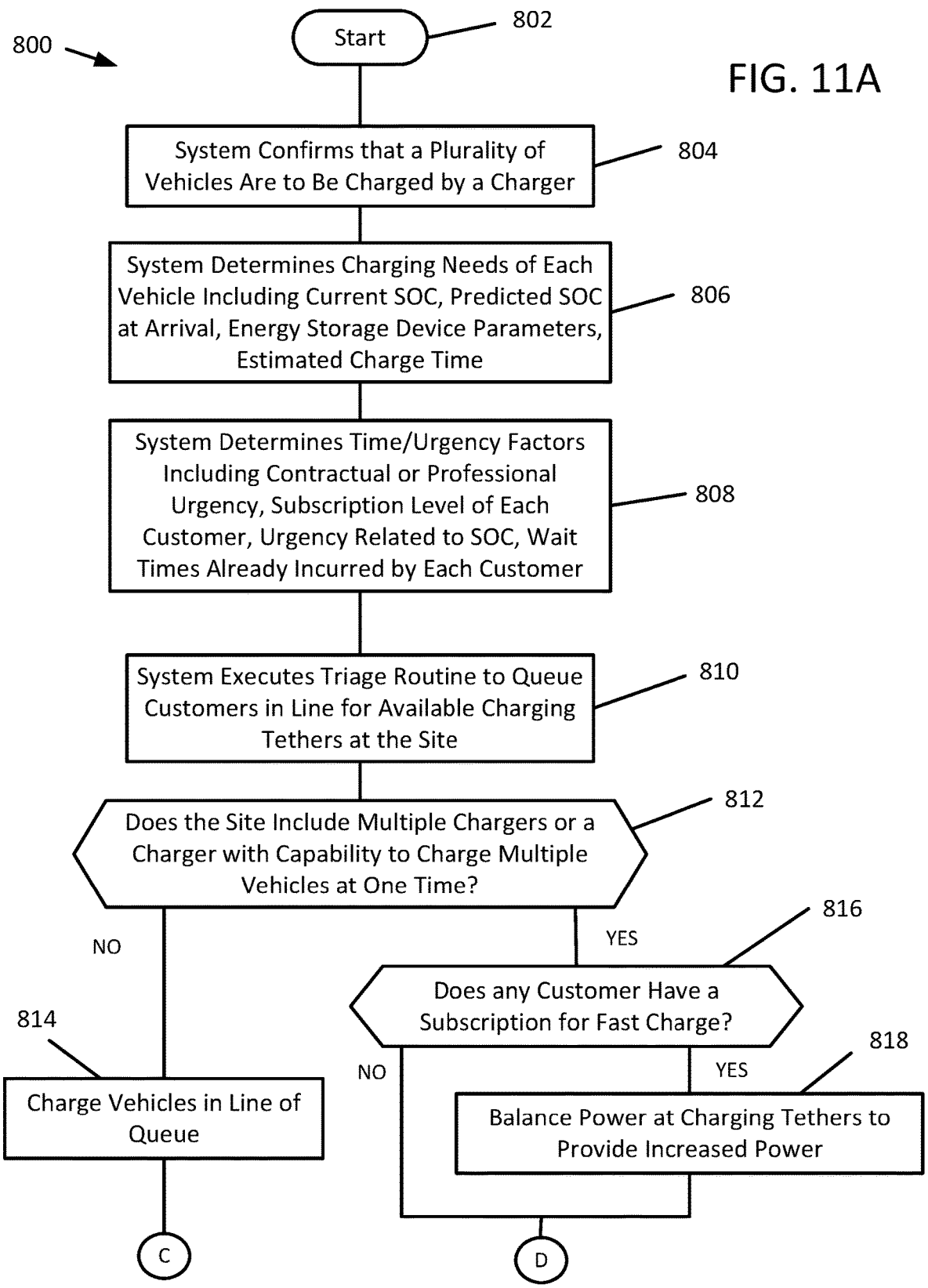
FIGS. 11A and 11B is a flowchart illustrating an exemplary process for scheduling a plurality of vehicles in a waiting queue to be charged, in accordance with the present disclosure.
Figure 11B:
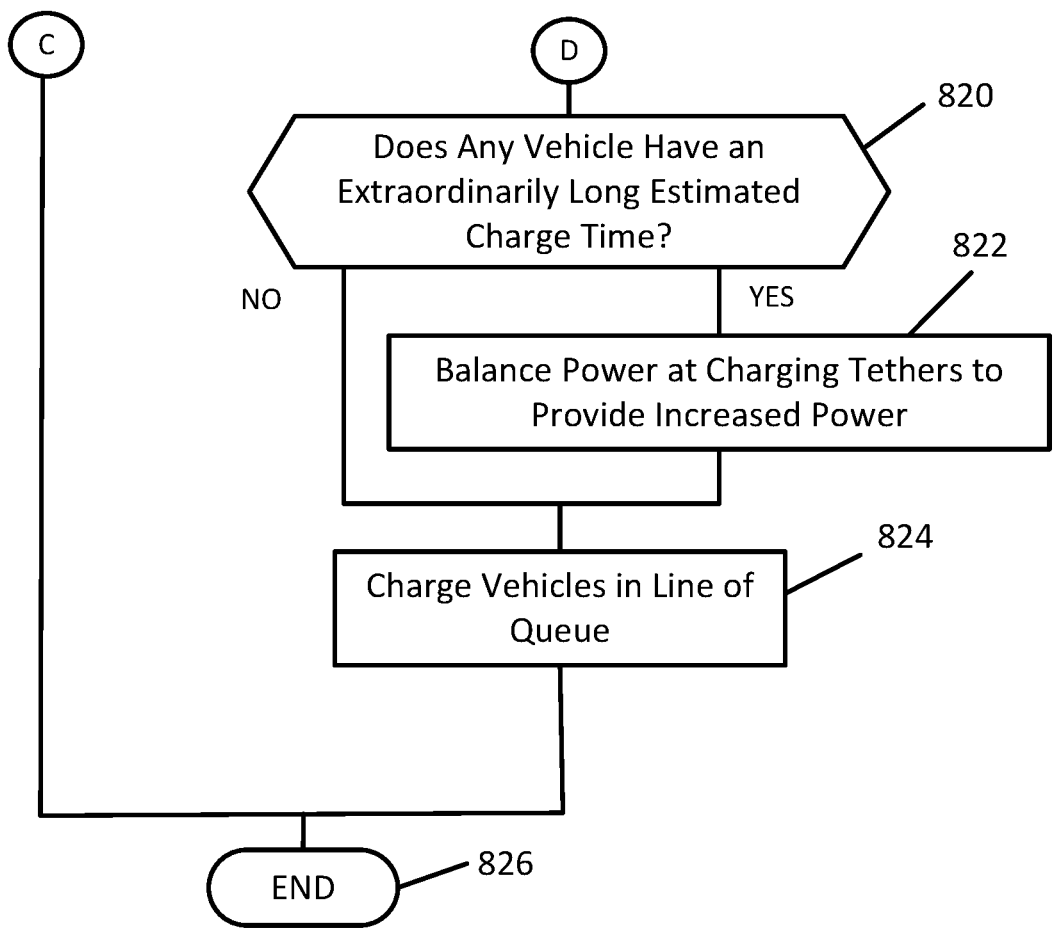

FIGS. 11A and 11B is a flowchart illustrating an exemplary process for scheduling a plurality of vehicles in a waiting queue to be charged. Process 800 starts at step 802. At step 804, the system confirms that a plurality of vehicles are to be charged by a charger, for example, by monitoring selection by a plurality of customers of the charger from various ranked listings of the various customers. At step 806, the system determines charging needs of each vehicle to be charged, including, for example, current SOC, predicted SOC when the vehicle arrives at the charger, energy storage device parameters for each of the vehicles, and estimated charging times for each of the vehicles. At step 808, the system determines time factors including, for example, urgency factors created by contractual or professional urgency (for example, responder or police vehicles), subscription levels for each customer, urgency created by low SOC, and wait times already incurred by the system upon individual customers. At step 810, the system performs a triage-style selection routine to queue customers in line for available charging tethers at the site of the charger. At step 812, a determination is made whether the site includes multiple chargers or includes a charger with capacity to charge more than one vehicle at a time. If the charger may charge one vehicle at a time, the process advances to step 814, where vehicles are charged in the line of the queue. If the charger or chargers at the site may charge multiple vehicles at one time, the process advances to step 816, wherein a determination is made whether one or more of the customers has a subscription for a fast charge. If no customer has such a subscription, the process advances to step 820. If a customer does have a subscription for a fast charge, the process advances to step 818, wherein the system complies with a fast charge requirement of the customer schedules balancing power at the available charging tethers during the charging of that customers vehicle to accomplish the required fast charging. At step 820, the system determines whether one or more vehicle in the queue has an extraordinarily estimate charge time, for example, associated with charging a large capacity battery of a commercial truck. If no vehicle in the queue has such an estimated charge time, the process advances to step 824. If a vehicle in the queue does have such an estimated charge time, the system at step 822 complies with accelerated charge requirements of the vehicle by scheduling balancing power at the available charging tethers during the charging of that customers vehicle to accomplish the accelerated charging, and the process then advances to step 824. At step 824, the charger or chargers charge vehicles in the line of the queue. At step 826, the process ends. It will be appreciated that process 800 may reiterate, periodically or continually scheduling or re-scheduling wait line queues based upon new information and new vehicles entering the queue. Process 800 is exemplary, a number of processes for scheduling vehicles in a wait line queue for a charger are envisioned, and the disclosure is not intended to be limited to the examples provided.

Figure 12:
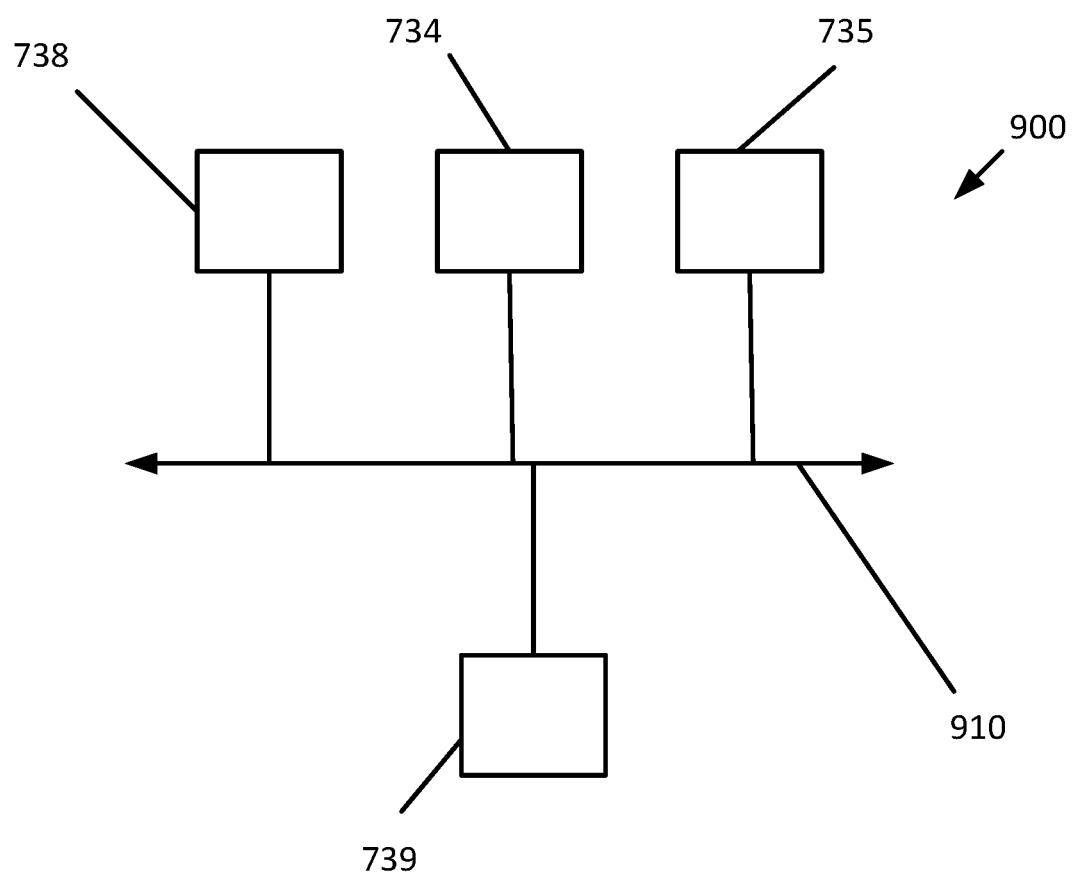
FIG. 12 illustrates an exemplary charger data communication and control architecture operable to provide information to a charger control device in accordance with an embodiment of the disclosed system, in accordance with the present disclosure.

FIG. 12 illustrates an exemplary charger data communication and control architecture operable to provide information to a charger control device in accordance with an embodiment of the disclosed system. Charger data communication and control architecture 900 is illustrated including various devices in communication with vehicle data bus 910. Data bus 910 includes a communicative device in the art for providing for data communication easily between different computerized systems or devices. Charger control device 739, fuel cell 734, fuel cell 735, and fuel cell bridge 738 are illustrated in electronic communication with each other through data bus 910. It will be appreciated that a mobile charger could be equipped with alternate charging hardware, for example, including an internal combustion engine, a battery energy storage device, a fuel cell-based charger with power electronics, or a fuel cell with energy-based battery and power electronics. Through data bus 910, charger control device 739 may acquire data from and issue commands to the other devices. Charger data communication and control architecture 900 is exemplary, a number of different data communication and control architecture are envisioned, and the disclosure is not intended to be limited to the examples provided herein.

Figure 13:
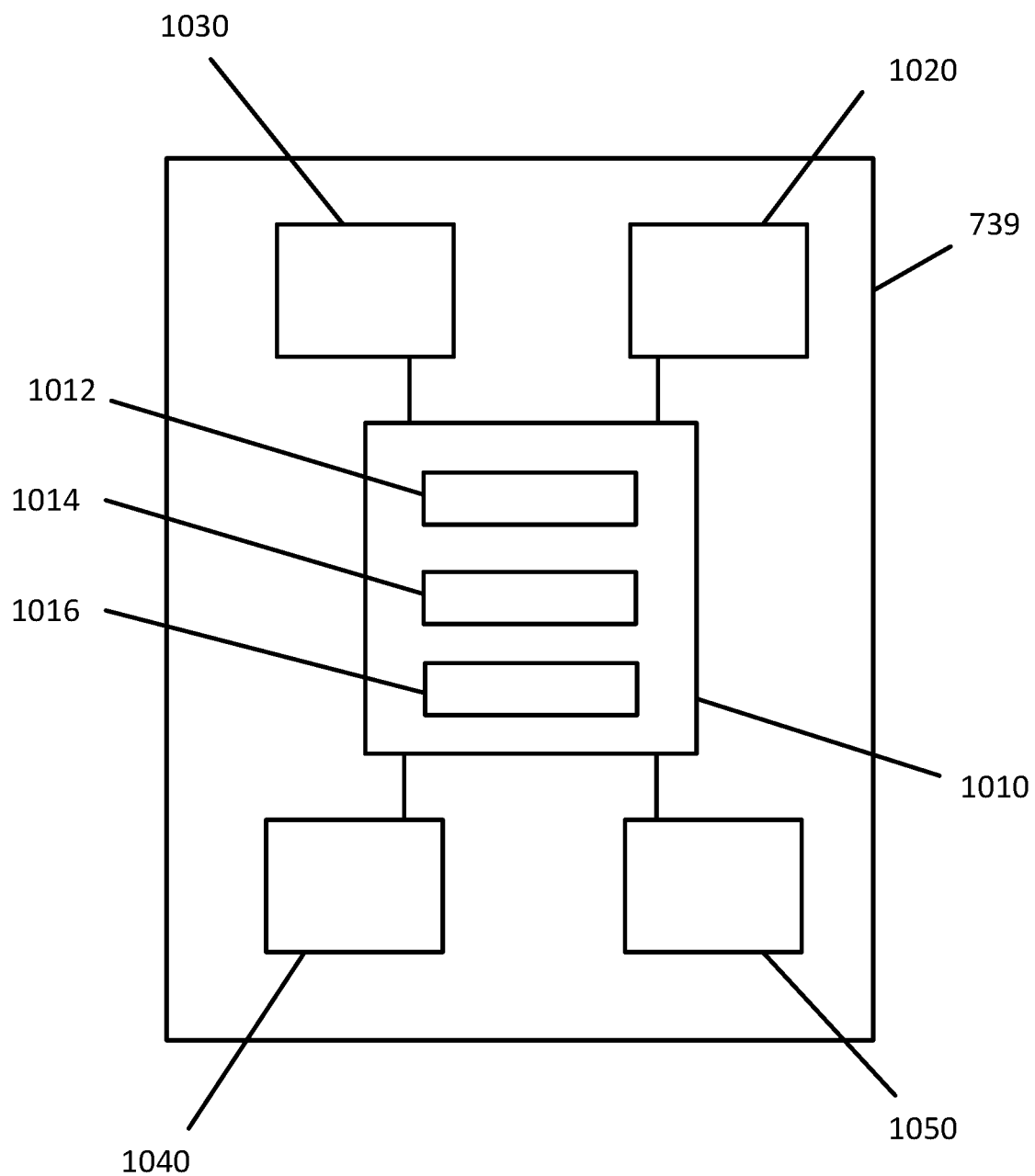
FIG. 13 illustrates an exemplary computerized charger control device, in accordance with the present disclosure.

FIG. 13 illustrates an exemplary computerized charger control device. Charger control device 739 may include processing device 1010 operable to operate computerized programming. In the illustrative embodiment illustrating optional features of the disclosed system, charger control module 739 includes a processing device 1010, a user interface 1030, communication device 1020, a memory device 1050, a global positioning system (GPS) 1040. It is noted that the charger control module 739 may include other components and some of the components are not required in accordance with the disclosure.

The processing device 1010 may include memory, e.g., read only memory (ROM) and random-access memory (RAM), storing processor-executable instructions and one or more processors that execute the processor-executable instructions. In embodiments where the processing device 1010 includes two or more processors, the processors may operate in a parallel or distributed manner. The processing device 1010 may execute the operating system of the charger control module 739. Processing device 1010 may include one or more modules executing programmed code or computerized processes or methods include executable steps. Illustrated modules may include a single physical device or functionality spanning multiple physical devices. In the illustrative embodiment, the processing device 1010 also executes server interface module 1012, a user display and input screen control module 1014, and a charger activation module 1016, which are described in greater detail below.

The user interface 1030 is a device that allows a user to interact with the charger control module 739. While one user interface 1030 is shown, the term "user interface" may include, but is not limited to, a touch screen, a physical keyboard, a mouse, a microphone, a speaker, and other user interface devices in the art.

The communication device 1020 may include a communications/data connection with a vehicle bus device operable to transfer data to different components of the vehicle and may include one or more wireless transceivers for performing wireless communication.

The memory device 1050 is a device that stores data generated or received by the charger control module 739. The memory device 1050 may include, but is not limited to, a hard disc drive, an optical disc drive, and/or a flash memory drive.

The GPS 1040 determines a location of the charger control module 739 by communicating with a plurality of GPS satellites. The GPS 1040 may perform triangulation techniques to determine the GPS coordinates of the charger control module 739. It should be appreciated that while a GPS 1040 is shown, another suitable component or device useful in the art for determining the location of the vehicle such as cell phone tower triangulation may be implemented.

Server interface module 1012 may receive and transmit information to and from a remote server operating the disclosed system and coordinates data for scheduling and operating a wait line queue of vehicles to be charged.

User display and input screen control module 1014 may be operable to coordinate presenting information to a technician or technicians operating the charger, for example, providing a graphical illustration of vehicles in the wait line queue, informing the technician of new information, such as canceled or emergency new charging sessions, and providing the technician with an ability to provide inputs to the system.

Charger activation module 1016 may be configured to monitor and control operations required to operate the charger. For example, charger activation module 1016 may monitor fuel levels, monitor scheduled refueling sessions, activate and deactivate the fuel cell(s) of the charger, monitor and control temperature of the fuel cells, provide and modulate power supplied through the charging tether(s) of the charger.

Charger control module 739 is exemplary, many alternative embodiments of such a control module are envisioned, and the disclosure is not intended to be limited to the examples provided.

Operation of the disclosed system over time, including detection of customer demand, traffic congestion, and lowest cost operation will enable the system and/or operations of the system to determine patterns of use of the mobile chargers and to direct the plurality of available mobile chargers to new locations based upon the determined patterns of use, either in real-time or predictively.

While the best modes for carrying out the disclosure have been described in detail, those familiar with the art to which this disclosure relates will recognize various alternative designs and embodiments for practicing the disclosure within the scope of the appended claims.

What is claimed is:

1. A computerized system for matching a plurality of electrically powered vehicles to a plurality of available mobile chargers, the system comprising:

the plurality of available mobile chargers each including
a finite supply of fuel useful to be converted into electrical energy; and a computerized server device, programmed to:
monitor optimization inputs related to the plurality of available mobile chargers;
monitor optimization inputs related to the plurality of electrically powered vehicles operated by a plurality of customers;

determine a price modulation for at least one of the plurality of available mobile chargers based upon the optimization inputs related to the plurality of available mobile chargers including availability of the finite supply of fuel of each of the plurality of available mobile chargers;

determine a lowest-cost-based ranked listing of matched charger and vehicle pairings, each of the matched charger and vehicle pairings including one of the plurality of available mobile chargers and one of the plurality of electrically powered vehicles, for each of the plurality of customers based upon the optimization inputs related to the plurality of available mobile chargers, the optimization inputs related to plurality of the electrically powered vehicles, and the price modulation;

present the ranked listing of the matched charger and vehicle pairings for each of the plurality of customers to each of the customers;

monitor selection by each of the plurality of customers of one of the matched charger and vehicle pairings to identify from the plurality of available mobile chargers a desired charger for the customer;

after the selection, scheduling each of the plurality of electrically powered vehicles to charge at the desired charger for the customer based upon the monitored selection by each of the plurality of customers, the optimization inputs related to the plurality of available mobile chargers, and the optimization inputs related to the plurality of electrically powered vehicles; and direct each of the plurality of customers to the desired charger for the customer;

wherein the price modulation is configured for one of increasing a price of one of the plurality of available mobile chargers or decreasing a price of one of the plurality of available mobile chargers to provide an incentive to one the plurality of customers to make the selection including selecting one of the plurality of available mobile chargers based upon managing depletion of the finite supply of fuel of each of the plurality of mobile chargers.

2. The computerized system of claim 1, wherein the computerized server device is further programmed to:

determine patterns of use of the available mobile chargers; and direct the plurality of available mobile chargers to new locations based upon the determined patterns of use.

3. The computerized system of claim 1, wherein the computerized server device programmed to determine the lowest-cost-based ranked listing of the matched charger and vehicle pairings for each of the plurality of customers based upon the optimization inputs related to the plurality of available mobile chargers comprises the computerized server device programmed to determine the lowest-cost-based ranked listing based upon one of the optimization inputs related to the plurality of available mobile chargers selected from one of geographic locations of the plurality of available mobile chargers or a fuel cell efficiency vs. load determination for each of the plurality of available mobile chargers.

4. The computerized system of claim 1, wherein the computerized server device programmed to determine the lowest-cost-based ranked listing of the matched charger and vehicle pairings for each of the plurality of customers based upon the optimization inputs related to the plurality of available mobile chargers comprises the computerized server device programmed to determine the lowest-cost-based ranked listing based upon one of the optimization inputs related to the plurality of available mobile chargers selected from one of a cost determination for each of the plurality of available mobile chargers, an electrical energy remaining in a rechargeable energy storage system determination for each of the plurality of available mobile chargers, or a thermal energy remaining in a thermal buffer determination for each of the plurality of available mobile chargers.

5. The computerized system of claim 1, wherein the computerized server device programmed to determine the lowest-cost-based ranked listing of the matched charger and vehicle pairings for each of the plurality of customers based upon the optimization inputs related to the plurality of available mobile chargers comprises the computerized server device programmed to determine the lowest-cost-based ranked listing based upon one of the optimization inputs related to the plurality of available mobile chargers selected from one of an on/off state determination for each of the plurality of available mobile chargers, an off timer setting determination for each of the plurality of available mobile chargers, a temperature of each fuel cell stack determination for each of the plurality of available mobile chargers, a weather forecast determination for each of the plurality of available mobile chargers, a solar forecast determination for each of the plurality of available mobile chargers, or a predicted harvestable and rejectable energy available determination for each of the plurality of available mobile chargers.

6. The computerized system of claim 1, wherein the computerized server device programmed to determine the lowest-cost-based ranked listing of the matched charger and vehicle pairings for each of the plurality of customers based upon optimization inputs related to the plurality of electrically powered vehicles operated by the plurality of customers comprises the computerized server device programmed to determine the lowest-cost-based ranked listing based upon one of the optimization inputs related to the plurality of electrically powered vehicles operated by the plurality of customers selected from a location of each of the plurality of electrically powered vehicles relative each of the plurality of available mobile chargers, historical parameters of each of the plurality of electrically powered vehicles, vehicle brand for each of the plurality of electrically powered vehicles, or a vehicle battery predicted charge profile for each of the plurality of vehicles.

7. The computerized system of claim 1, wherein the computerized server device programmed to determine the lowest-cost-based ranked listing of the matched charger and vehicle pairings for each of the plurality of customers based upon optimization inputs related to the plurality of electrically powered vehicles operated by the plurality of customers comprises the computerized server device programmed to determine the lowest-cost-based ranked listing based upon one of the optimization inputs related to the plurality of electrically powered vehicles operated by the plurality of customers selected from a planned customer destination for each of the plurality of customers, planned trip information for each of the plurality of customers, preference for each of the plurality of customers to certain hydrogen fuel feedstock, a customer subscription level for each of the plurality of customers, points of interest for each of the plurality of customers, saved favorite chargers for each of the plurality of customers, or minimum tolerable state of charge for each of the plurality of customers.

8. The computerized system of claim 1, wherein the computerized server device programmed to determine the lowest-cost-based ranked listing of the matched charger and vehicle pairings for each of the plurality of customers comprises the computerized server device programmed to maximize fuel efficiency of the plurality of available mobile chargers.

9. The computerized system of claim 1, wherein the computerized server device programmed to determine the lowest-cost-based ranked listing of the matched charger and vehicle pairings for each of the plurality of customers comprises the computerized server device programmed to minimize financial cost to the plurality of customers.

10. The computerized system of claim 1, wherein the computerized server device programmed to determine the lowest-cost-based ranked listing of the matched charger and vehicle pairings for each of the plurality of customers comprises the computerized server device programmed to minimize traffic congestion around the plurality of available mobile chargers.

11. The computerized system of claim 1, wherein the computerized server device programmed to schedule each of the plurality of electrically powered vehicles to charge at the desired charger for the customer based upon the optimization inputs related to the plurality of electrically powered vehicles includes scheduling each of the plurality of electrically powered vehicles to charge at the desired charger for the customer based upon charging needs of each of the plurality of electrically powered vehicles.

12. The computerized system of claim 1, wherein the computerized server device programmed to schedule each of the plurality of electrically powered vehicles to charge at the desired charger for the customer based upon the optimization inputs related to the plurality of electrically powered vehicles includes scheduling each of the plurality of electrically powered vehicles to charge at the desired charger for the customer based upon urgency related factors of each of the plurality of electrically powered vehicles.

13. The computerized system of claim 1, wherein the computerized server device programmed to schedule each of the plurality of electrically powered vehicles to charge at the desired charger for the customer based upon the optimization inputs related to the plurality of electrically powered vehicles includes scheduling each of the plurality of electrically powered vehicles to charge at the desired charger for the customer based upon complying with fast charge requirements of one of the plurality of customers.

14. The computerized system of claim 13, wherein complying with the fast charge requirements includes balancing power at a plurality of charging tethers at one of the plurality of available mobile chargers.

15. The computerized system of claim 1, wherein the computerized server device programmed to schedule each of the plurality of electrically powered vehicles to charge at the desired charger for the customer based upon the optimization inputs related to the plurality of electrically powered vehicles includes scheduling each of the plurality of electrically powered vehicles to charge at the desired charger for the customer based upon complying with accelerated charge requirements of one of the plurality of customers.

16. The computerized system of claim 15, wherein complying with the accelerated charge requirements includes balancing power at a plurality of charging tethers at one of the plurality of available mobile chargers.

17. The computerized system of claim 1, wherein the computerized server device programmed to direct each of the plurality of customers to the desired charger for the customer comprises the computerized server device programmed to generate a map display showing a location of the desired charger.

18. A computerized system for matching a plurality of electrically powered vehicles to a plurality of available mobile chargers, the system comprising:
the plurality of available mobile chargers each including a finite supply of fuel useful to be converted into electrical energy; and
a computerized server device, programmed to:
monitor optimization inputs related to the plurality of available mobile chargers;
monitor optimization inputs related to the plurality of electrically powered vehicles operated by a plurality of customers;
determine a price modulation for at least one of the plurality of available mobile chargers based upon the optimization inputs related to the plurality of available mobile chargers including availability of the finite supply of fuel of each of the plurality of available mobile chargers;
determine a lowest-cost-based ranked listing of matched charger and vehicle pairings, each of the matched charger and vehicle pairings including one of the plurality of available mobile chargers and one of the plurality of electrically powered vehicles, for each of the plurality of customers based upon the optimization inputs related to the plurality of available mobile chargers, the optimization inputs related to the plurality of the electrically powered vehicles, and the price modulation;
present the ranked listing of the matched charger and vehicle pairings for each of the plurality of customers to each of the customers;
monitor selection by each of the plurality of customers of one of the matched charger and vehicle pairings to identify from the plurality of available mobile chargers a desired charger for the customer;
direct each of the plurality of customers to the desired charger for the customer;
schedule wait line queues for each of the plurality of available mobile chargers based upon the monitored selection by each of the plurality of customers, the optimization inputs related to the plurality of available mobile chargers, and the optimization inputs related to the plurality of electrically powered vehicles;
determine patterns of use of the available mobile chargers; and
direct the plurality of available mobile chargers to new locations based upon the determined patterns of use;
wherein the price modulation is configured for one of increasing a price of one of the plurality of available mobile chargers or decreasing a price of one of the plurality of available mobile chargers to provide an incentive to one the plurality of customers to make the selection including selecting one of the plurality of available mobile chargers based upon managing depletion of the finite supply of fuel of each of the plurality of mobile chargers.

19. A computerized method for matching a plurality of electrically powered vehicles to a plurality of available mobile chargers, the method comprising:
operating the plurality of available mobile chargers each including a finite supply of fuel useful to be converted into electrical energy; and
within a computerized server device:

monitoring optimization inputs related to the plurality of available mobile chargers;

monitoring optimization inputs related to the plurality of electrically powered vehicles operated by a plurality of customers;

determining a price modulation for at least one of the plurality of available mobile chargers based upon the optimization inputs related to the plurality of available mobile chargers including availability of the finite supply of fuel of each of the plurality of available mobile chargers;

determining a lowest-cost-based ranked listing of matched charger and vehicle pairings, each of the matched charger and vehicle pairings including one of the plurality of available mobile chargers and one of the plurality of electrically powered vehicles, for each of the plurality of customers based upon the optimization inputs related to the plurality of available mobile chargers, the optimization inputs related to the plurality of the electrically powered vehicles, and the price modulation;

presenting the ranked listing of the matched charger and vehicle pairings for each of the plurality of customers to each of the customers;

monitoring selection by each of the plurality of customers of one of the matched charger and vehicle pairings to identify from the plurality of available mobile chargers a desired charger for the customer;

after the selection, scheduling each of the plurality of electrically powered vehicles to charge at the desired charger for the customer based upon the monitored selection by each of the plurality of customers, the optimization inputs related to the plurality of available mobile chargers, and the optimization inputs related to the plurality of electrically powered vehicles; and directing each of the plurality of customers to the desired charger for the customer;

wherein the price modulation is configured for one of increasing a price of one of the plurality of available mobile chargers or decreasing a price of one of the plurality of available mobile chargers to provide an incentive to one the plurality of customers to make the selection including selecting one of the plurality of available mobile chargers based upon managing depletion of the finite supply of fuel of each of the plurality of mobile chargers.

* * * * *